(12) United States Patent
Lopez Julia et al.

(10) Patent No.: US 11,343,888 B1
(45) Date of Patent: May 24, 2022

(54) MICROLED POWER CONSIDERING OUTLIER PIXEL DYNAMIC RESISTANCE

(71) Applicant: Lumileds LLC, San Jose, CA (US)

(72) Inventors: Antonio Lopez Julia, Vaals (DE); Zhi Hua Song, Palo Alto, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/123,021

(22) Filed: Dec. 15, 2020

(51) Int. Cl.
| | |
|---|---|
| *H05B 45/30* | (2020.01) |
| *H05B 45/325* | (2020.01) |
| *G09G 3/32* | (2016.01) |
| *H05B 45/14* | (2020.01) |

(52) U.S. Cl.
CPC .......... *H05B 45/14* (2020.01); *H05B 45/325* (2020.01)

(58) Field of Classification Search
CPC ........ H05B 45/10; H05B 45/14; H05B 45/30; H05B 45/31; H05B 45/325; H05B 45/44; H05B 45/46; H05B 45/52; H05B 45/60; G09G 3/32; G09G 3/3225; G09G 3/3233; G09G 3/34; G09G 3/3406
See application file for complete search history.

(56) References Cited

U.S. PATENT DOCUMENTS

| | | | |
|---|---|---|---|
| 8,120,555 B2 | 2/2012 | Cok | |
| 8,159,152 B1 * | 4/2012 | Salessi | .............. F21V 29/54 |
| | | | 315/309 |
| 10,136,487 B2 * | 11/2018 | Wang | ............. H05B 45/37 |
| 10,734,897 B2 | 8/2020 | Petersen | |
| 2006/0022214 A1 | 2/2006 | Morgan et al. | |
| 2011/0156593 A1 | 6/2011 | De et al. | |
| 2012/0063121 A1 * | 3/2012 | Atkins | ............ H05B 45/14 |
| | | | 362/97.1 |
| 2013/0249419 A1 | 9/2013 | Zhang et al. | |

(Continued)

FOREIGN PATENT DOCUMENTS

| | | |
|---|---|---|
| KR | 20180068946 A | 6/2018 |
| WO | WO-2020004705 A1 | 1/2020 |

OTHER PUBLICATIONS

"International Application Serial No. PCT/US2021/061271, International Search Report dated Mar. 24, 2022", 5 pgs.

(Continued)

*Primary Examiner* — Thai Pham
(74) *Attorney, Agent, or Firm* — Schwegman Lundberg & Woessner, P.A.

(57) ABSTRACT

Discussed herein are systems, devices, methods, and computer-readable media for reducing a number of undriven or underdriven uLEDs of a uLED die. A method can include identifying, by a controller of a micro light emitting diode (uLED) die, a dynamic series resistance ($R_d$) or forward voltage ($V_f$) of a uLED of the uLED die, selecting, by the controller and based on the identified $R_d$ or $V_f$, a current level ($I_{PWM\_0}$) less than a maximum current level ($I_{PWM\_MAX}$) supplied by a uLED driver coupled to the uLED die, and causing, by the controller, current, at the selected current level, to be supplied to the uLED driver.

20 Claims, 15 Drawing Sheets

(56) References Cited

U.S. PATENT DOCUMENTS

| | | |
|---|---|---|
| 2017/0244008 A1 | 8/2017 | Kwon et al. |
| 2018/0070417 A1* | 3/2018 | Galvano .............. H05B 45/325 |
| 2018/0174931 A1* | 6/2018 | Henley .................. H01L 33/36 |
| 2019/0004105 A1* | 1/2019 | Henley .................. H01L 33/62 |
| 2019/0147793 A1 | 5/2019 | Valentine |
| 2020/0084868 A1 | 3/2020 | Bonne |

OTHER PUBLICATIONS

"International Application Serial No. PCT/US2021/061271, Written Opinion dated Mar. 24, 2022", 4 pgs.

* cited by examiner

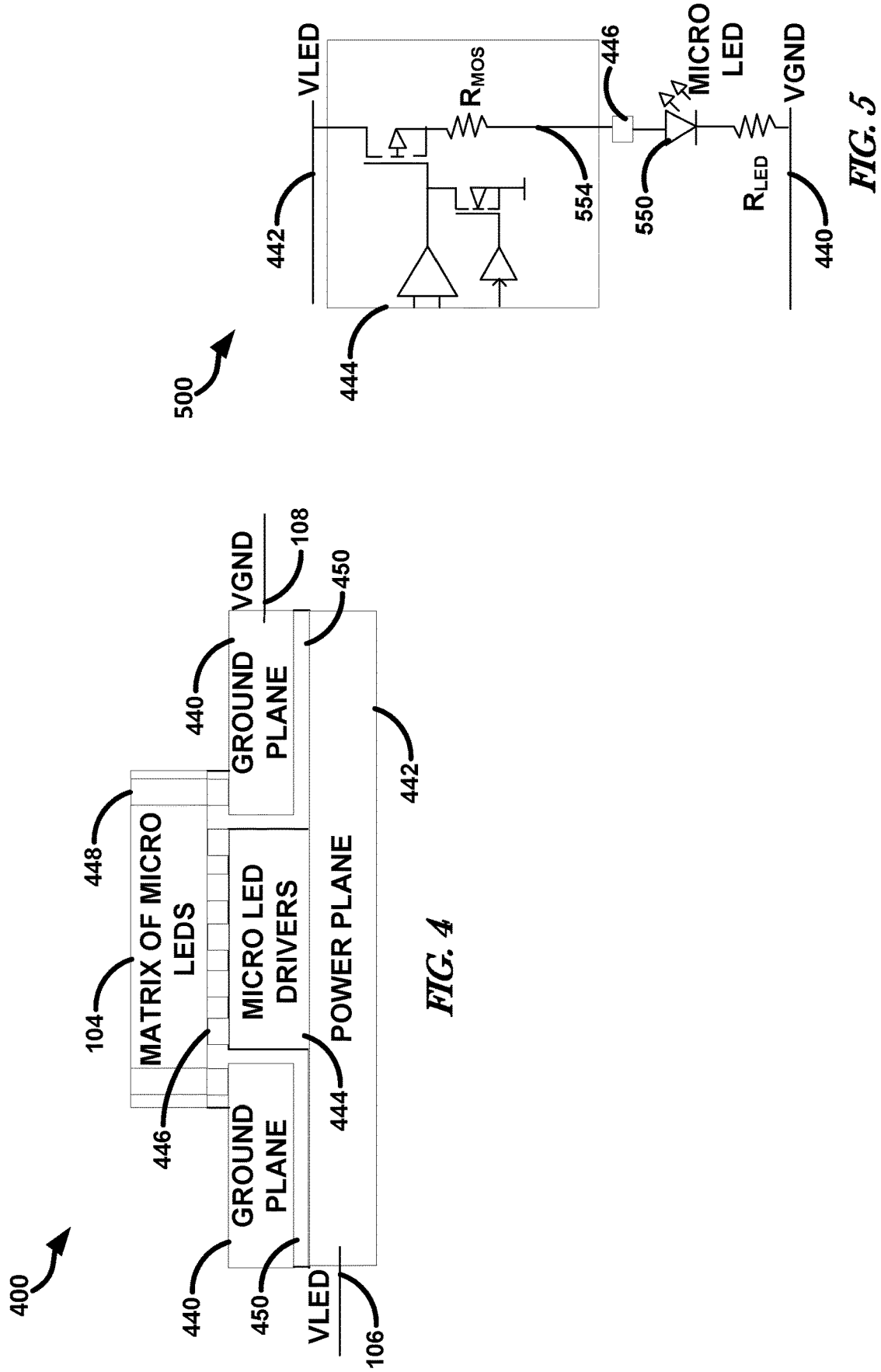

US 11,343,888 B1

MICROLED POWER CONSIDERING OUTLIER PIXEL DYNAMIC RESISTANCE

TECHNICAL FIELD

The present disclosure relates to a light-emitting apparatus and a light-emitting apparatus control system configured to reduce or eliminate dark aberrations experienced with an abnormally high dynamic series resistance of a light emitting diode (LED).

BACKGROUND

In some applications, such as home or commercial lighting, user experience in terms of visible effect of the lighting is very important. Automotive lighting is another application in which user experience is very important. If a dynamic series resistance of a light emitting diode (LED) is high, a forward voltage of the LED can be above the supply voltage, and the LED will likely not operate as expected. Such LEDs can appear as black or darker spots among lit LEDs.

BRIEF DESCRIPTION OF THE DRAWINGS

The figures show various views of an apparatus, system, or method, including a control system that can alter light emerging from one or more light emitting diodes (LEDs), in accordance with some embodiments. The terms "front," "rear," "top," "side," and other directional terms are used merely for convenience in describing the apparatuses and systems and other elements and should not be construed as limiting in any way.

FIG. 4 illustrates, by way of example, a conceptual block diagram of an embodiment of a package including a matrix of uLEDs and corresponding driver circuitry.

FIG. 5 illustrates, by way of example, a circuit diagram of an embodiment of a uLED pixel (uLED driver circuitry and a corresponding uLED).

DETAILED DESCRIPTION

Figure 1:
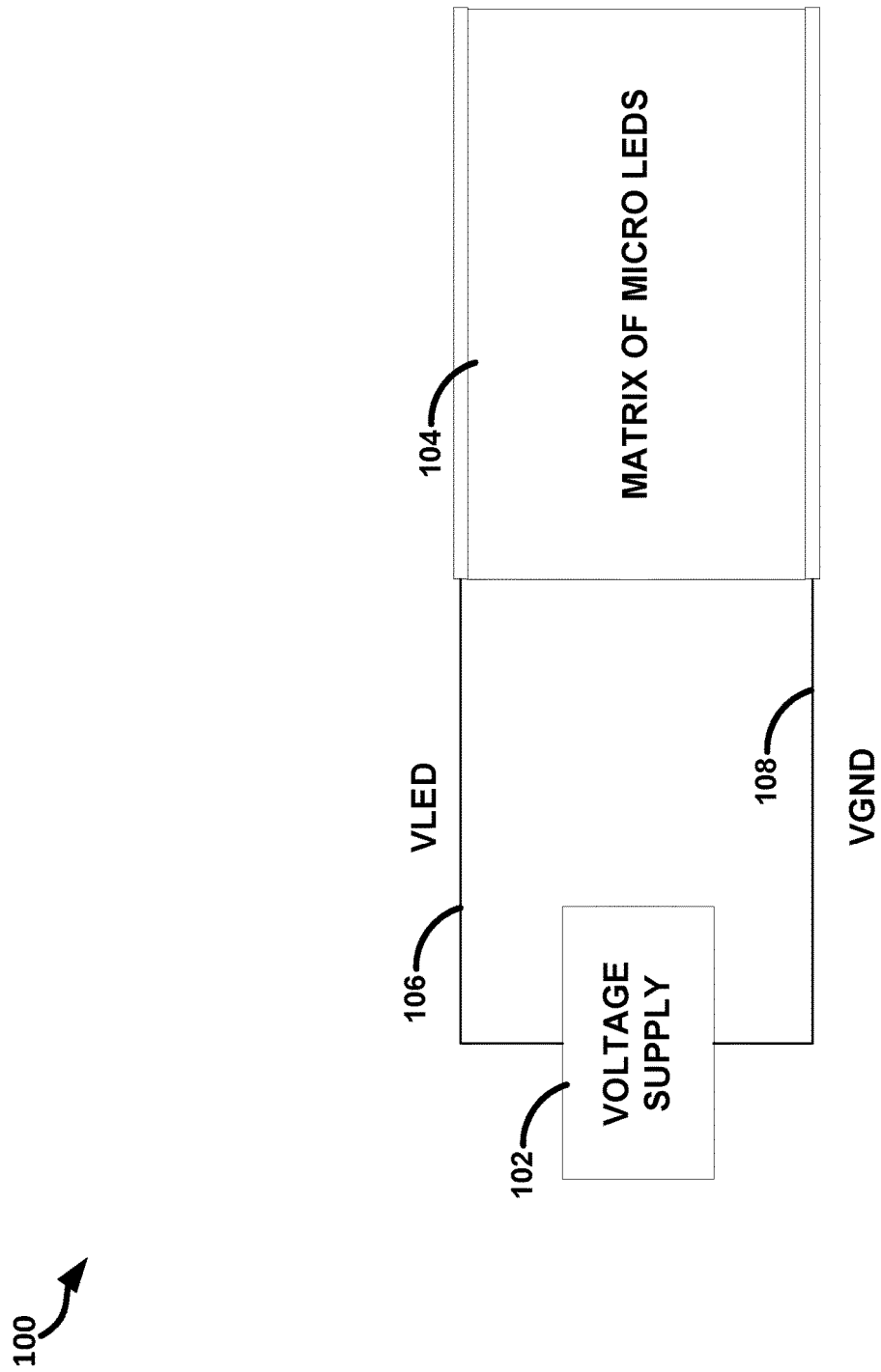
FIG. 1 illustrates, by way of example, a logical block diagram of an embodiment of a system for driving a die including a matrix of micro LEDs (uLEDs).

Compact, pixelated LEDs, such as in an array of micro LEDs (sometimes presented as "uLED") on a uLED die, can include a large monolithic die area. The uLED array can be used for automotive lighting, such as headlights, taillights, parking lights, fog lamps, direction lights, or the like. Such applications are merely examples and many other applications of uLED arrays are possible.

The uLED array can include a die of uLEDs hybridized with driver electronics for the control of individual pixel brightness. The driver electronics can be manufactured using, for example, complementary metal oxide semiconductor (CMOS) materials or processes or other semiconductor manufacturing processes.

In some embodiments, the driver electronics (uLED driver) can implement a linear driving scheme. The linear driving schemes are one practical solution for such control electronics, particularly for large uLED array configurations. However, special care is demanded in a linear driving scheme to control the voltage supply to the driver electronics, such as to provide both stable uLED current supply and acceptable heat losses. To help ensure that more uLED drivers are operated above their compliance voltage (voltage at which they provide sufficient electrical power to a corresponding uLED being driven by the driver), the voltage supply to the driver electronics is generally set above the highest forward voltage ($V_f$) of the uLEDs in the array. However, such a setting is not temperature or energy efficient.

An advantage of monolithic uLED chips is that they favor a narrow dispersion of forward voltages ($V_f$) among the uLED population (e.g., standard deviations<100 milliVolts). This forward voltage ($V_f$) homogeneity reduces heat loss, such as by reducing a voltage difference between a voltage supplied and the forward voltage ($V_f$) of the uLEDs. Unfortunately, there can still be a small but relevant group of outlier uLEDs whose forward voltage ($V_f$) is excessively high (e.g., greater than 20%, 25%, a greater or lesser percentage, or a percentage therebetween higher than the average forward voltage ($V_f$) of the uLEDs).

One solution to providing sufficient supply voltage includes providing a supply voltage that is greater than (or equal to) a highest $V_f$ for all of the uLEDs on the die, including the outliers. Using this solution, all uLEDs, including the outliers, will be properly driven. However, heat losses will increase (in some practical cases, to prohibitive levels) as the voltage drop across the driver electronics will, on average, increase.

Another solution includes no consideration for outlier uLEDs. Such skipping of outliers allows the supply voltage to remain low, thereby benefiting from the narrow forward voltage ($V_f$) dispersion among the uLEDs. In this solution, heat losses will be reduced compared to the solution that increases the voltage supply voltage to account for one or more of the $V_f$ of outliers. However, using such a solution, it is likely that some outlier uLEDs will be undriven or underdriven. Such undriven and/or underdriven uLEDs can appear as dark spots on the uLED array. A larger population of outliers can be prohibitive in some applications, especially if the undriven and/or under driven uLEDs remain visible.

Embodiments can include a (e.g., simple) driving scheme to provide voltage compliance to outlier uLED drivers so that the corresponding uLEDs can light up with minor impact on heat losses or operation efficiency. Advantages provided by embodiments can address one or more of the following challenges of pixelated matrix LEDs driven with linear driver schemes: (1) providing a cost-effective driving scheme of matrix uLEDs; (2) overcoming driver efficiency limitations; (3) overcoming voltage compliance limitations; or (4) addressing forward voltage dispersion across population of pixels where outliers compromise either voltage compliance or driver efficiency.

In embodiments, the abnormally high $V_f$ can be a product of a dynamic series resistance of uLEDs. The dynamic series resistance can be due to process tolerances affecting the quality of elements, such as metal-semiconductor contacts. Based on these considerations, embodiments can include a current driver (uLED driver) that provides voltage compliance to outlier uLEDs that can operate normally or substantially light up (light up to an intensity within a specified number or percentage of lumens as specified without consideration for dynamic series resistance) with minor impact on heat losses.

Embodiments can provide a uLED driver control technique in which outlier pixels can be identified (e.g., see FIG. 9) by means of a sensing voltage, and classified as such. This can be done either during the assembly process of the uLED die or periodically, for instance, during diagnosis mode. Embodiments can provide a uLED driver control scheme in which a preset on-current value of a pulse width modulation (PWM) current can be adjusted for those identified outlier uLEDs whose $V_f$ exceeds the compliance voltage of the average population (e.g., by a specified amount). This can be done either during the assembly process of the uLED die or periodically, for instance, during a diagnosis mode after fabrication of the uLED die.

Embodiments can provide a driver control technique wherein the preset on-current value of the PWM current is lowered below a maximum PWM current ($I_{PWM\_MAX}$) such that $V_f$ of the outlier pixels falls sufficiently below $V_{LED}$. This can bring a local uLED driver unit into a compliance voltage mode.

Embodiments can provide a driver control technique in which a preset on-current value of the PWM current is lowered below $I_{PWM\_MAX}$ to a new value $I_{PWM\_O}$ this value being approximately and/or partly estimated from the difference in series dynamic resistance ($R_d$) between the outlier uLED and those of the average population. The $R_d$ can be characterized during the assembly process or periodically during diagnosis mode by means of driving pixels at different current levels (e.g., around target $I_{PWM\_MAX}$). $R_d$ can be determined as a difference between $V_{fmax}$ and $V_{th}$ (see FIG. 10, for example) divided by $I_{PWM}$. An rand of $R_d$ can thus be defined as $[R_{dlow}, R_{dhigh}]$. $R_{dlow} = (V_{fmax} - V_{th})/I_{PWM\_MAX}$. Likewise. $R_{dhigh} = (V_{fmax} - V_{th})/I_{PWM\_O}$. Note that $V_{th}$ and $I_{PWM\_MAX}$ are given by technology, design and operating conditions. Fixing them, yields a direct relation between $V_{fmax}$ (e.g., supply voltage) and $R_d$.

FIG. 1 illustrates, by way of example, a diagram of an embodiment of a uLED control system 100. The system 100 as illustrated includes a voltage supply 102 that provides power distributed by a plurality of LED drivers to a matrix of uLEDs 104. The voltage supply 102 provides a constant direct current (DC) voltage $V_{LED}$ 106 and a constant reference voltage $V_{GND}$ 108. The voltage supply 102 can fix the voltage supply to the DC level of $V_{LED}$ 106. This voltage does not dynamically change with a load line response (a load of the array of uLEDs 104). Thus, $V_{LED}$ 106 does not change dynamically change during a pulse width modulation (PWM) period of the current driver signals.

As previously discussed, if $V_{LED}$ 106 is set to account for the outlier pixels of the array of uLEDs 104, the heat losses in the drivers of the uLEDs will be high (even prohibitively high). Conversely, if the $V_{LED}$ 106 is set without consideration of the Vf of the outlier uLEDs, the outlier uLEDs can remain undriven or under driven. Such undriven or under driven LEDs can appear as dark spots in the matrix of uLEDs 104.

Figure 2:
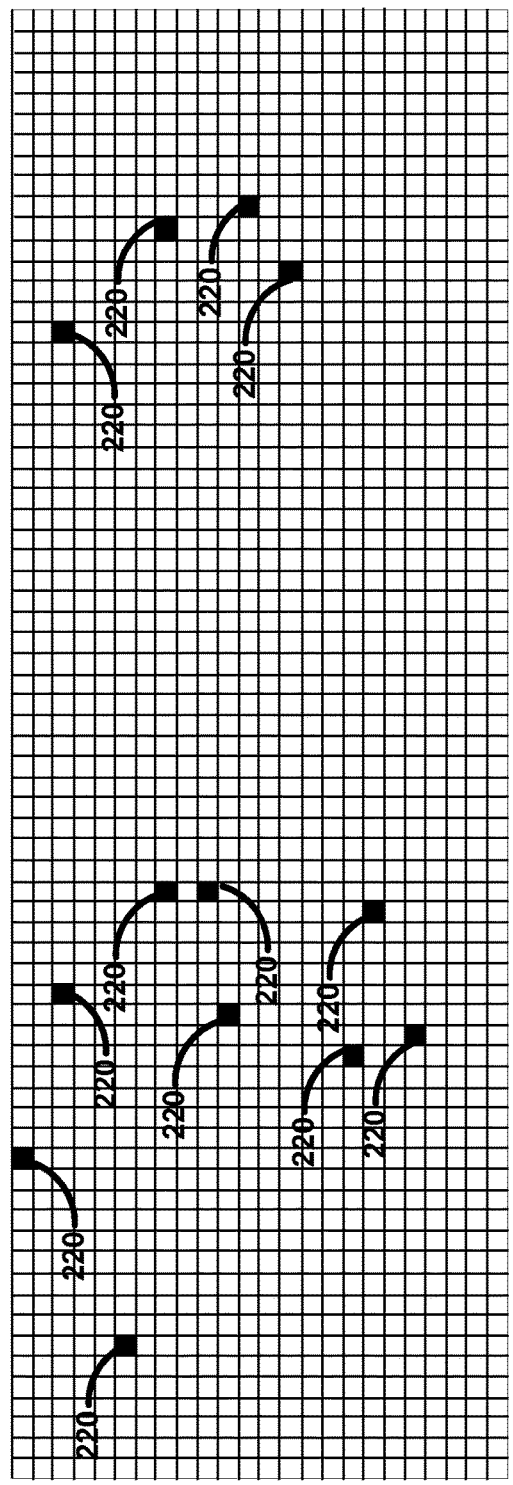
FIG. 2 illustrates, by way of example, a perspective view of an embodiment of a uLED die that includes undriven and/or underdriven uLEDs.

FIG. 2 illustrates, by way of example, a diagram of an embodiment of an array of uLEDs 200 driven without consideration of Vf of the outlier uLEDs. As can be seen, some uLEDs remain undriven or under driven, resulting in black or darker spots 220 in the array of uLEDs 200.

Figure 3:
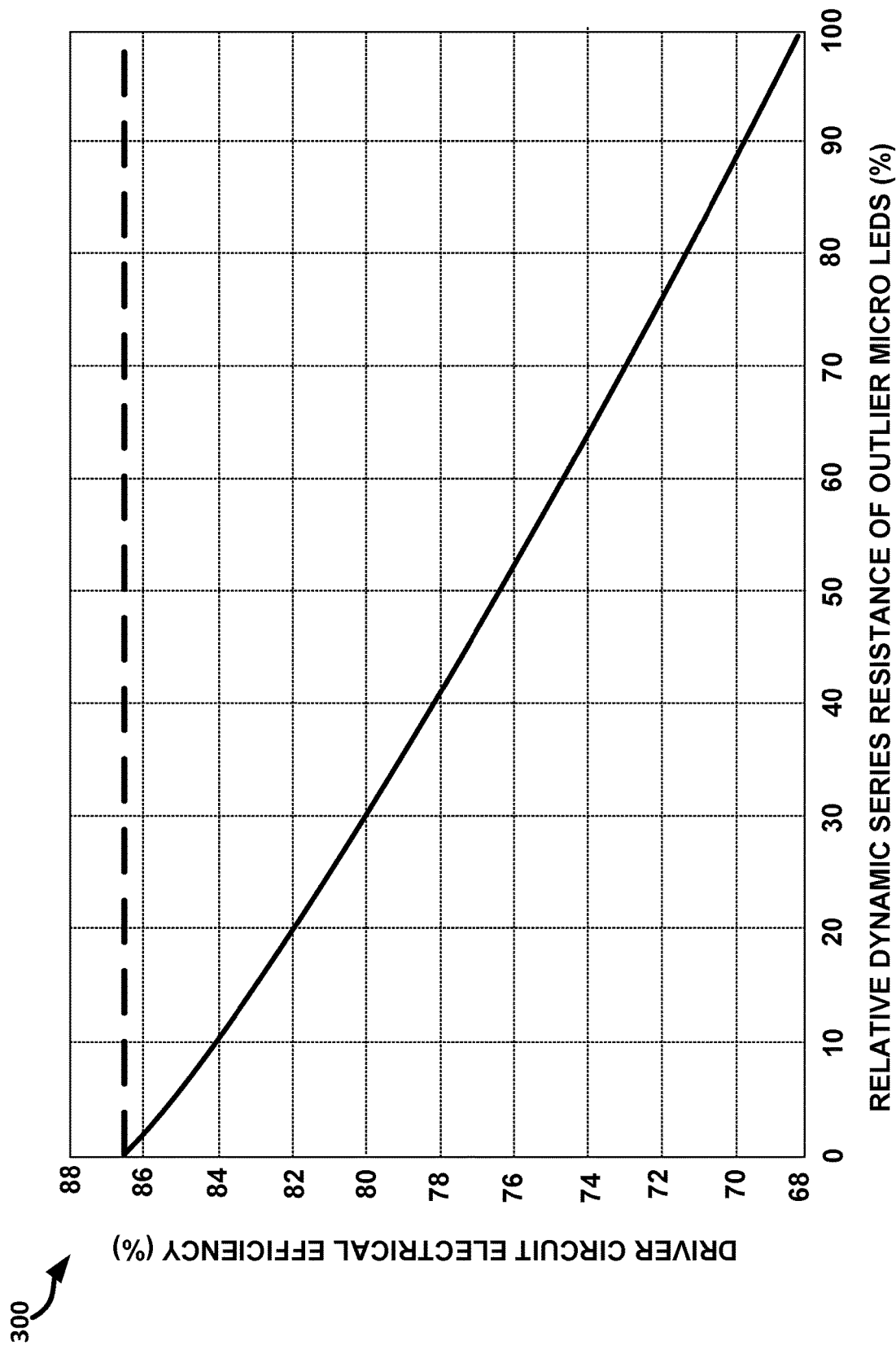
FIG. 3 illustrates, by way of example, a diagram of an embodiment of a graph of efficiency of the driver circuit versus relative dynamic series resistance of outlier uLEDs.

FIG. 3 illustrates, by way of example, a diagram of an embodiment of a graph 300 of efficiency of the driver circuit versus relative dynamic series resistance of outlier uLEDs (as a % of all uLEDs in the array of uLEDs 200). As can be seen, as the dynamic resistance of uLEDs that are considered outliers increases, the driver circuit electrical efficiency decreases. A goal can be to keep the electrical efficiency greater than, for example, 85%, 80%, a greater of lesser percentage or some percentage therebetween. Electrical efficiency is defined as power output divided by the power provided. For example, if the outlier $R_d$ increases by 20% over the population of LEDs in the matrix of uLEDs 104, the driver efficiency drops from 86% (reference efficiency considering no outliers) down to 82%.

FIG. 4 illustrates, by way of example, a logical block diagram of an embodiment of a system 400 including an electrical backplane electrically coupled to the matrix of uLEDs 104. The electrical backplane includes uLED drivers 444 and power provisioning circuitry. Further details of a linear driver version of the uLED drivers 444 are provided regarding FIG. 5. The power provisioning circuitry includes $V_{LED}$ 106 and the reference voltage $V_{GND}$ 108 from the voltage supply. The $V_{LED}$ 106 is provided to a power plane 442. The $V_{GND}$ 108 is provided to a ground plane 440. The uLED drivers 444 are powered using the $V_{LED}$ 106 from the power plane 442. The uLED drivers 444 control, via an electrical interconnect 446 individual or groups of uLEDs in the matrix of uLEDS 104. The uLED drivers 444 can control whether the uLED is on, off, a duty cycle, or other power control of the uLEDs 104.

The matrix of uLEDs 104 are electrically coupled to the (respective) uLED drivers 444 through the electrical interconnects 446. The matrix of uLEDs 104 are electrically coupled to the ground plane 440 through other electrical interconnects 448. A dielectric 450 electrically and physically separates the uLED drivers 444 from the ground plane 440. That is, the dielectric 450 is situated (e.g., directly) between the uLED drivers 444 and the ground plane 440 and (e.g., directly) between the ground plane 440 and the power plane 442.

FIG. 5 illustrates, by way of example, a logical circuit diagram of an embodiment of a system 500 that includes the uLED driver 444 and a uLED 550 of the matrix of uLEDs 104. The uLED driver 444 controls an electrical signal 554 on the electrical interconnect 446. The uLED driver 444, by controlling the electrical signal 554, can inhibit or allow current to flow to the uLED 550. Using this control, the uLED driver 444 can ultimately control whether and when the individual or group of uLEDs 550 is on and the duty cycle of the uLEDs.

To overcome the limitations of other uLED driving schemes and to increase electrical efficiency of a matrix of uLEDs 104, some improved driving schemes are provided. Embodiments consider uLED dies with individually addressable pixels. The uLED dies include uLED drivers 444 that include linear driver architectures operating in PWM mode. The control scheme(s) can help minimize the total root mean square (RMS) and harmonic current driven by the voltage supply 102, by at least in part, the phases of pulse width modulation (PWM) control signals of the uLEDs being randomized.

Embodiments can include a voltage supply 102, the output voltage of which can be dynamically modulated and controlled by a load (e.g., a controller 990 of the load (see FIG. 9)) with a sufficient bandwidth response Embodiments can include a control scheme wherein outlier pixels can be identified (e.g., by means of a sensing voltage, and classified as such (see FIG. 9)), before or during runtime of the matrix of uLEDs 104. The controller 990 can cause the voltage from the voltage supply 102 to increase to a specified voltage value as a function of the dynamic resistance ($R_d$) of the uLED during every cycle or every several cycles of the PWM signal of the drivers. The higher voltage can be specified as a function of a dynamic series resistance of the outlier uLED.

Embodiments can include a control scheme that repeatedly (e.g., periodically, such as at predefined intervals) increases the voltage supply to a specified voltage value during every cycle or every several cycles of the PWM signal of the drivers. Said higher set voltage can be specified as a function of the forward voltage ($V_f$) of the outlier pixels. A forward voltage ($V_f$) of an LED is the voltage drop across the LED while the LED is illuminating.

Embodiments can include a control scheme to alter a voltage to and a current provided by a uLED driver 444 of a uLED 550. Embodiments can provide a control scheme that includes a modifiable set current of outlier pixels.

Figure 6:
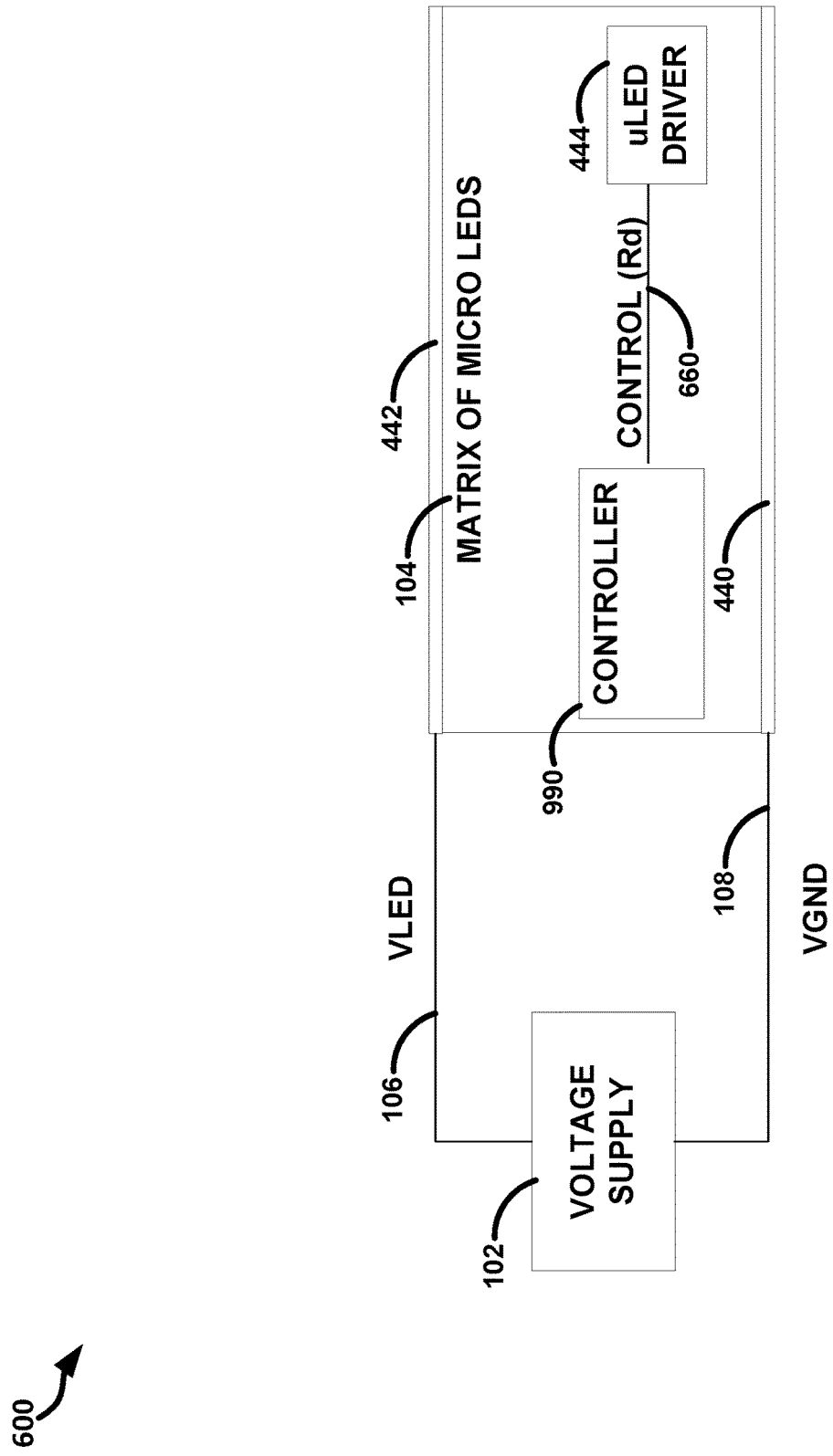
FIG. 6 illustrates, by way of example, a logical circuit diagram of an embodiment of a system that considers outlier pixel dynamic series resistance ($R_d$) to drive the matrix of uLEDs.

FIG. 6 illustrates, by way of example, a logical circuit diagram of an embodiment of a system 600 that considers outlier pixel $R_d$ to drive the matrix of uLEDs 104. The system 600 is the same as or similar to the uLED control system 100, with the system 600 including circuitry to provide a control command 660 that causes electrical power to be provided to the uLED driver 444 (see FIG. 4) based on $R_d$. The control command 660 can indicate a voltage or current that is based on a dynamic series resistance of a specific uLED 550 of the matrix of uLEDs 104. The control command 660 indicates the voltage to be supplied to the uLED driver 444. The control command 660 can be issued by the controller 990 coupled to the uLED drivers 444.

The controller 990 can include a memory 988 (see FIG. 9) or otherwise have access to a memory that includes data indicating $R_d$, duty cycle, PWM period, or the like for at least each uLED that has an abnormally high $R_d$. The controller 990 can use this data to provide the command 660 that causes the voltage to the uLED driver 444 to decrease thus decreasing the electrical current supplied by the uLED driver 444. The electrical current can be set so that the forward voltage ($V_f$) is less than a maximum of the supply voltage $V_{LED}$.

Figure 7:
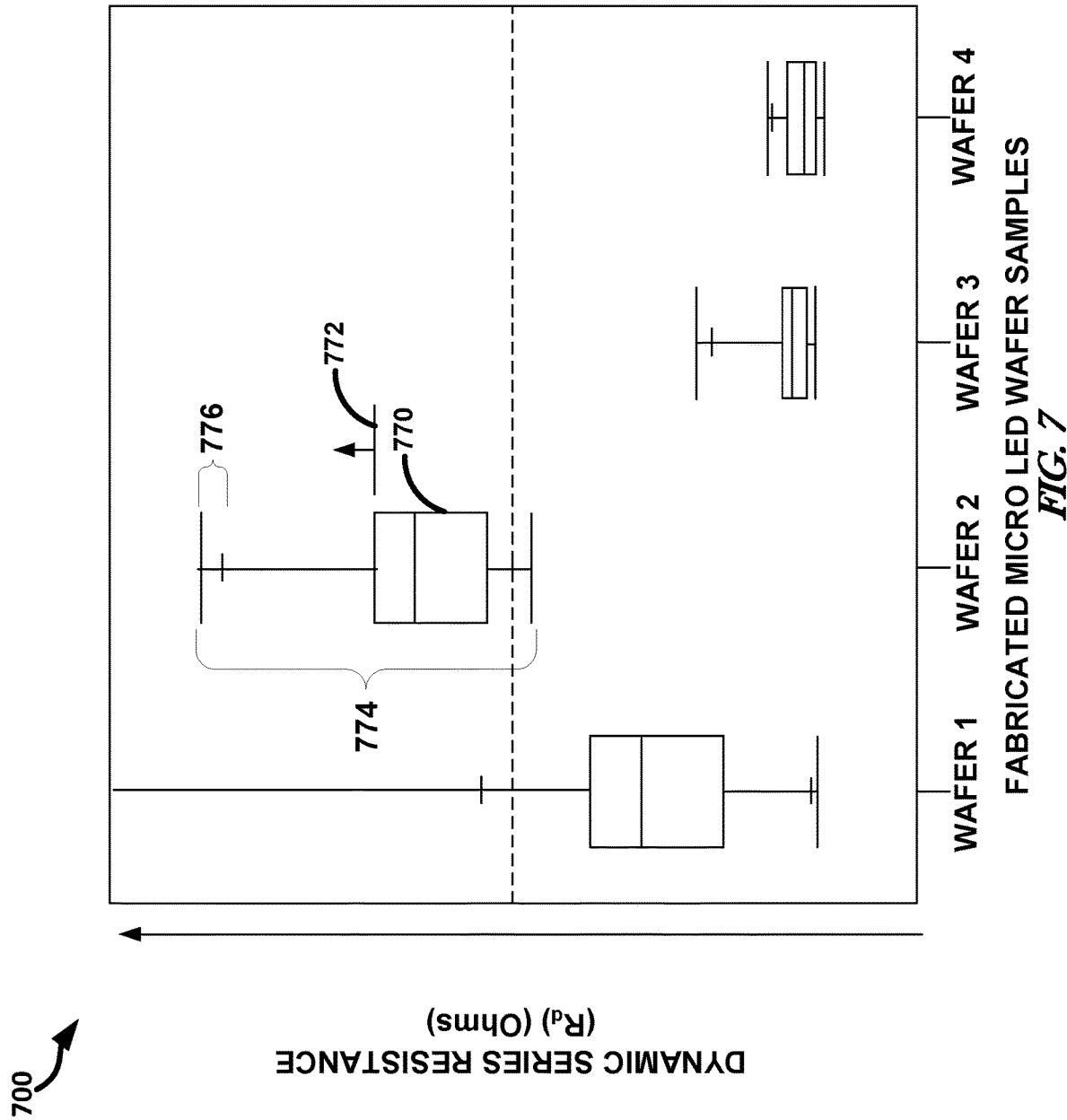
FIG. 7 illustrates, by way of example, a graph of an embodiment of $R_d$ distributions for a plurality of uLED matrix dies.

FIG. 7 illustrates, by way of example, a graph 700 of an embodiment of dynamic series resistance ($R_d$) distributions for a plurality of uLED matrix dies. One of the distributions 774 includes a majority of uLEDs with $R_d$ in a lower three quartiles 770 and $R_d$ in an upper quartile 772. Outlier uLEDs include outlier $R_d$ 776. The outlier $R_d$ can be defined as a highest percentile (e.g., 75%, 80%, 85%, 90%, 95%, a greater percentage, or some percentage therebetween) of the uLEDs of the matrix of uLEDs 104 ranked by $R_d$, uLEDs of the matrix of uLEDs 104 with an $R_d$ greater than a specified threshold (e.g., the $R_d$ at a specified percentile, $R_d$ a specified number of standard deviations above average, or the like).

If $V_{LED}$ 106 is set to a level that covers a specified percentile of the uLEDs based on the $R_d$, the uLEDs 552 with outlier $R_d$ 776 may be undriven or underdriven. As previously discussed, this undriven or underdriven condition can result in dark spots or other aberrations in the image produced by the matrix of uLEDs 104.

Figure 8:
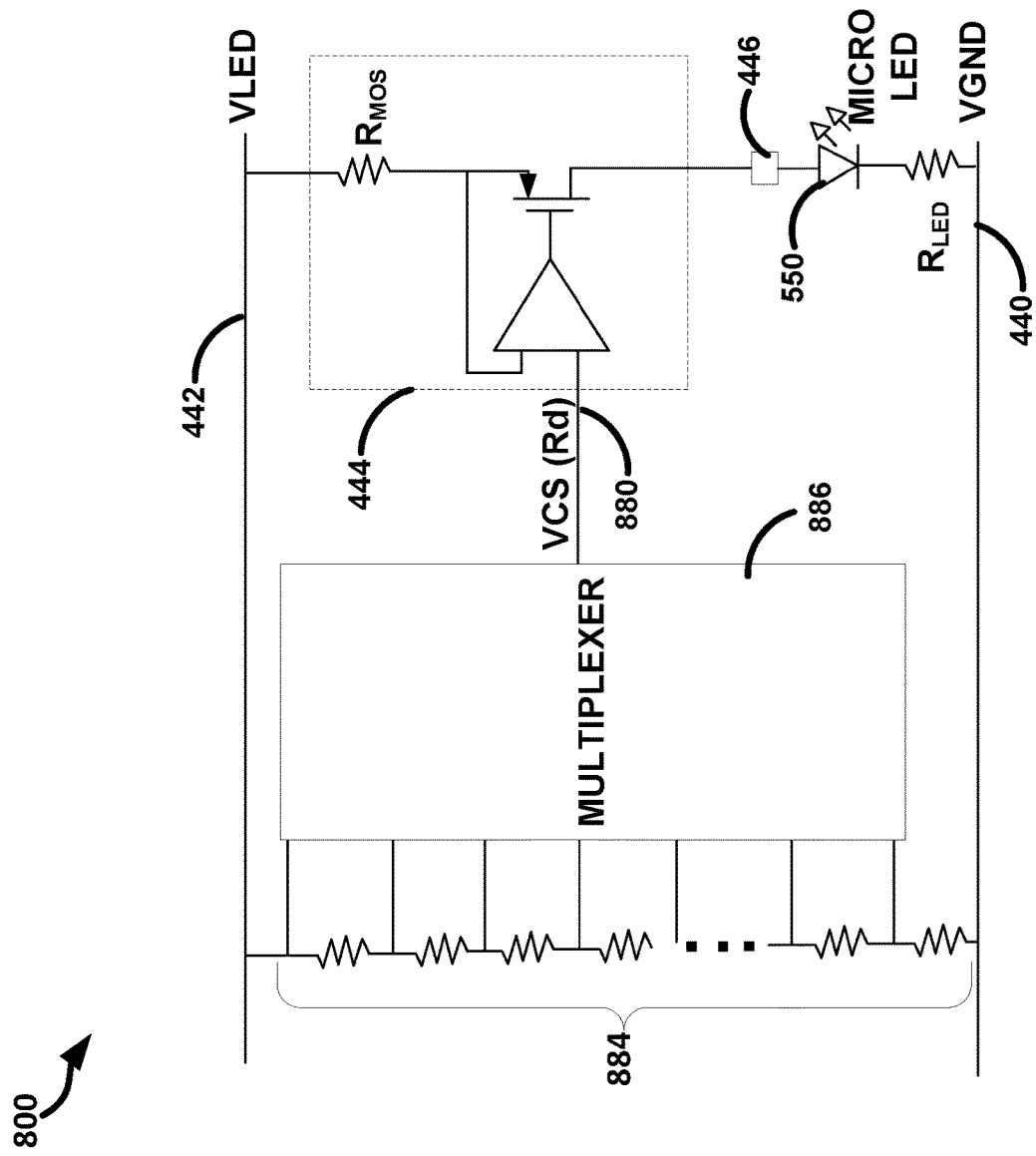
FIG. 8 illustrates, by way of example, a circuit diagram of an embodiment of a uLED pixel.

FIG. 8 illustrates, by way of example, a circuit diagram of an embodiment of a uLED pixel (a uLED 550 and a corresponding uLED driver 444 (e.g., a uLED driver 444 that drives only the single uLED 550 or a small group of uLEDs (less than 10 uLEDs)). In the circuit diagram 800 of FIG. 8, the uLED driver 444 is driven using a voltage VCS 880 that is dependent on the Rd of the uLED. The VCS 880 can be from a circuit (e.g., a resistor ladder and a multiplexer, for example) that operates to provide a variety of VCS 880 values. The controller 990 can select the VCS 880 that corresponds to the Rd of the uLED so as to reduce $V_f$ to below VLED 106. This reduction in driving voltage (VCS 880) reduces a driving current provided by the uLED driver 444. The reduction in driving current, in turn, causes a reduction in the intensity of the uLED 550. The controller 990 can compensate for the reduction in intensity by increasing a duty cycle of the uLED 550.

Figure 9:
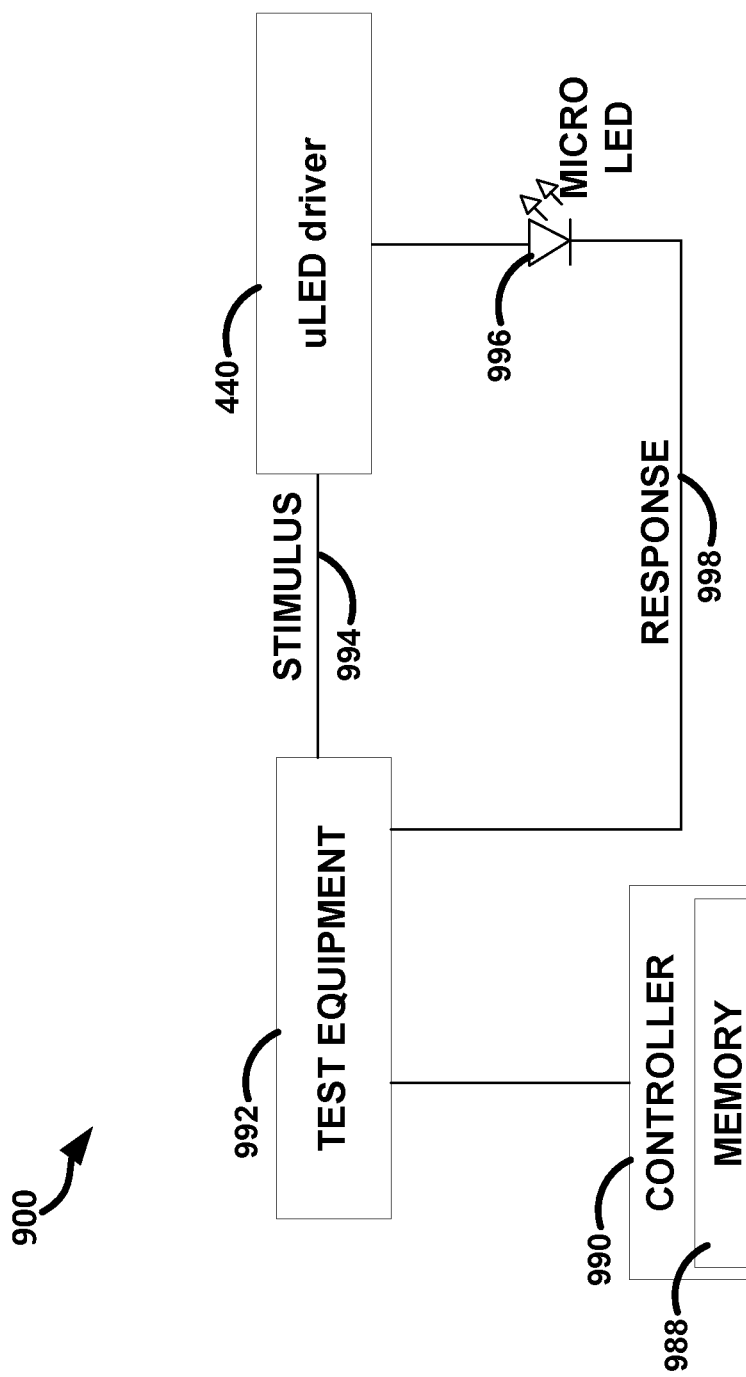
FIG. 9 illustrates, by way of example, a diagram of an embodiment of a system for analysing $R_d$ of uLEDs of a uLED die.

FIG. 9 illustrates, by way of example, a diagram of an embodiment of a system 900 for analysing dynamic resistance (Rd) of uLEDs of a uLED die. To use embodiments, and as discussed, the controller 990 can be used as part of the matrix of uLEDs 104. The controller 990 can have access to or include a memory 988.

The memory 988 can store data indicating which uLEDs have an abnormally high $R_d$ (and a corresponding abnormally high $V_f$). To determine whether a uLED 996 has an abnormally high $R_d$, an electrical stimulus 994 can be provided to the uLED driver 444 by test equipment 992. The test equipment 992 can include an electrical power supply, similar to the voltage supply 102. The test equipment 992 can be operable to vary an amplitude, frequency, or other parameter of a current or voltage supplied as the stimulus 994.

The stimulus 994 can include a voltage that is going to be used to drive the uLED driver 444 most of the time ($V_{LED}$ 106). If a response 998 that is sufficient is detected, the uLED 996 can be considered normal. If a response that is insufficient 998 is detected, the uLED 996 can be considered to have an outlier $R_d$.

In response to a response 998 that is insufficient (a current below an expected (threshold) current) the test equipment 992 can cause an identification of the uLED 996 (e.g., by position in the matrix of uLEDs, such as by row and column, or other identification) to be stored in the memory 988 of the controller 990 (or a memory accessible by the controller 990). That way the controller 990 can determine when to cause the uLED driver 444 to drive the uLED with a reduced current. One or more of the operations of FIG. 9 can be performed during fabrication, after packaging, or during some other phase of manufacturing or distribution, or a combination thereof.

The controller 990 can include electric or electronic components configured to perform operations thereof. The electric or electronic components can include one or more transistors, resistors, capacitors, diodes, inductors, oscillators, switches, logic gates (e.g., AND, OR, XOR, negate, buffer, or the like), multiplexers, analog to digital converters, digital to analog converters, amplifiers, rectifiers, modulators, demodulators, processors (e.g., central processing units (CPUs), graphics processing units (GPUs), application specific integrated circuits (ASICs), field programmable gate arrays (FPGAs), or the like), memory devices (e.g., random access memory (RAM), read only memory (ROM), or the like), or the like.

The driver 444 can include electrical or electronic components configured to implement power provision to the uLED(s) of the matrix of uLEDs 104 (sometimes called the uLED die). The electric or electronic components can include one or more transistors, resistors, capacitors, diodes, inductors, oscillators, switches, logic gates, multiplexers, analog to digital converters, digital to analog converters, amplifiers, rectifiers, modulators, demodulators, processors, memory devices, or the like.

Figure 10:
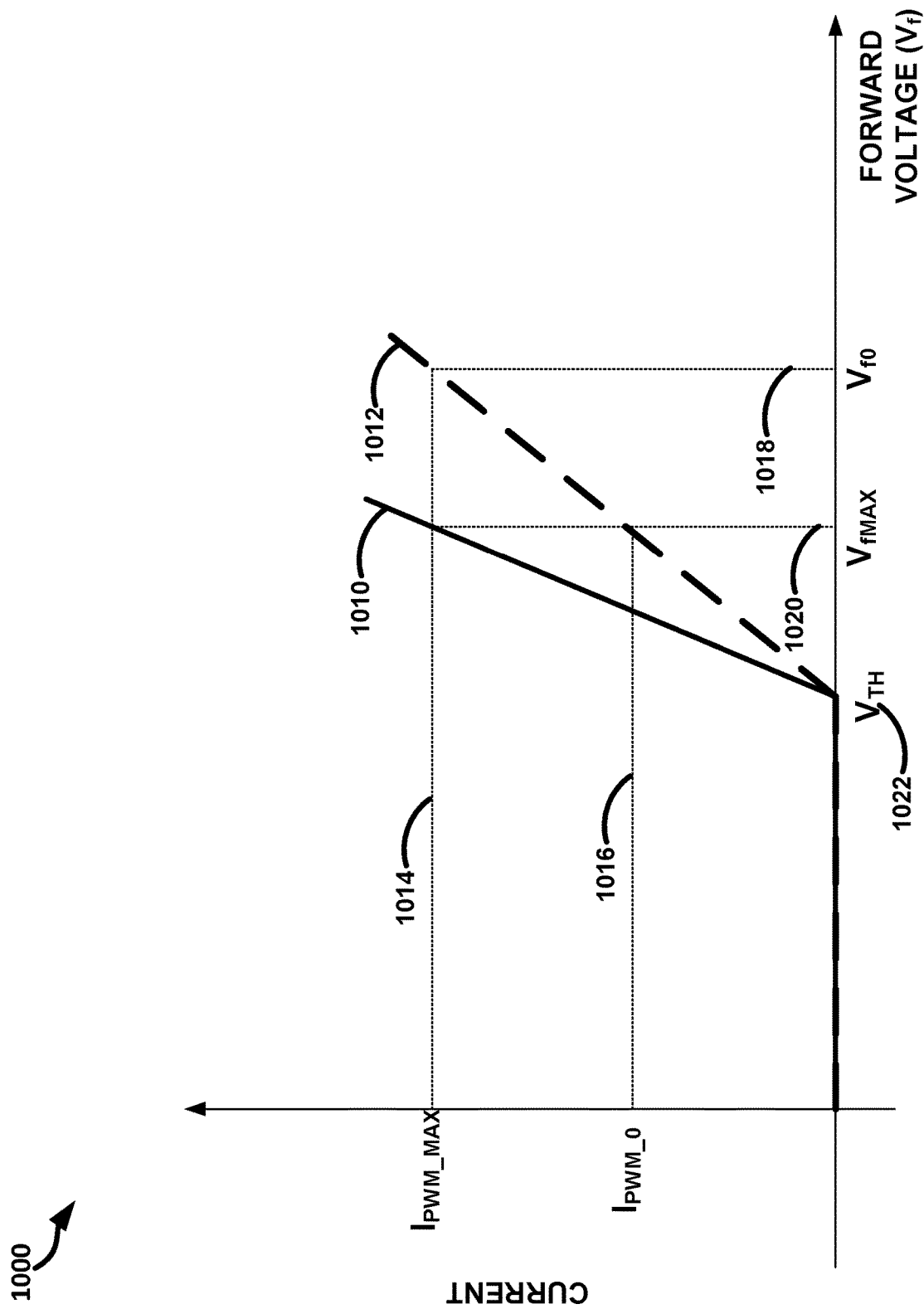
FIG. 10 illustrates, by way of example, a graph of current vs voltage of a uLED with an outlier $R_d$ and a uLED with a lower $R_d$.

FIG. 10 illustrates, by way of example, a graph 1000 of current versus voltage of a uLED with an outlier $R_d$ and a uLED with a lower $R_d$. Solid line 1010 corresponds to the uLED with normal $R_d$ and dashed line 1012 corresponds to the uLED with outlier $R_d$. As can be seen, a principal difference between lines 1010, 1012 is $R_d$ (inverse of the slope of the lines 1010, 1012). In FIG. 10, the threshold voltage 1022 (sometimes called band gap) is the same or similar for the uLEDs, assuming they both operate at the same temperature (note that this is not a necessary condition and Vth of the uLEDs can be different). When driving these uLEDs at the same on-state current $I_{PWM\_MAX}$, the forward voltages differ by $V_{fo}$ 1018-$V_{fmax}$ 1020. This difference is dictated by the $R_d$ differences in the uLEDs.

Embodiments lower a current driving the outlier pixels down to current level $I_{PWM\_0}$ 1016. Driving the outlier pixel at the lower current level, $I_{PWM\_0}$ 1016, such that the voltage of the outlier drops from $V_{fo}$ to voltage compliance $V_{fmax}$. $V_{fmax}$ corresponds to the maximum $V_{LED}$ produced by the voltage supply 102.

In the driver diagram of FIG. 8, this is achieved by making control voltage $V_{cs}$ a function of $R_d$. $V_{cs}$ is the voltage signal that controls current ($I_{PWM}$) provided to the uLED.

In state-of-the-art linear current drivers for LED arrays, $V_{cs}$ is constant and substantially the same among all LEDs. In contrast, embodiments allow $V_{cs}$ to be set differently (e.g., per uLED) for the uLEDs with outlier Rd. This forces the PWM on state current ($I_{PWM}$) to be lower than $I_{PWM\_MAX}$ (a driver current produced in response to driving the uLED driver 444 using $V_{LED}$). The lower current illustrated in FIG. 10 is $I_{PWM\_0}$ 1016. According to the change in the supply voltage, the new value for $V_{cs}$ enables the forward voltage ($V_f$) of the uLEDs with outlier $R_d$ to lower such that it is lower than $V_{LED}$.

Figure 11:
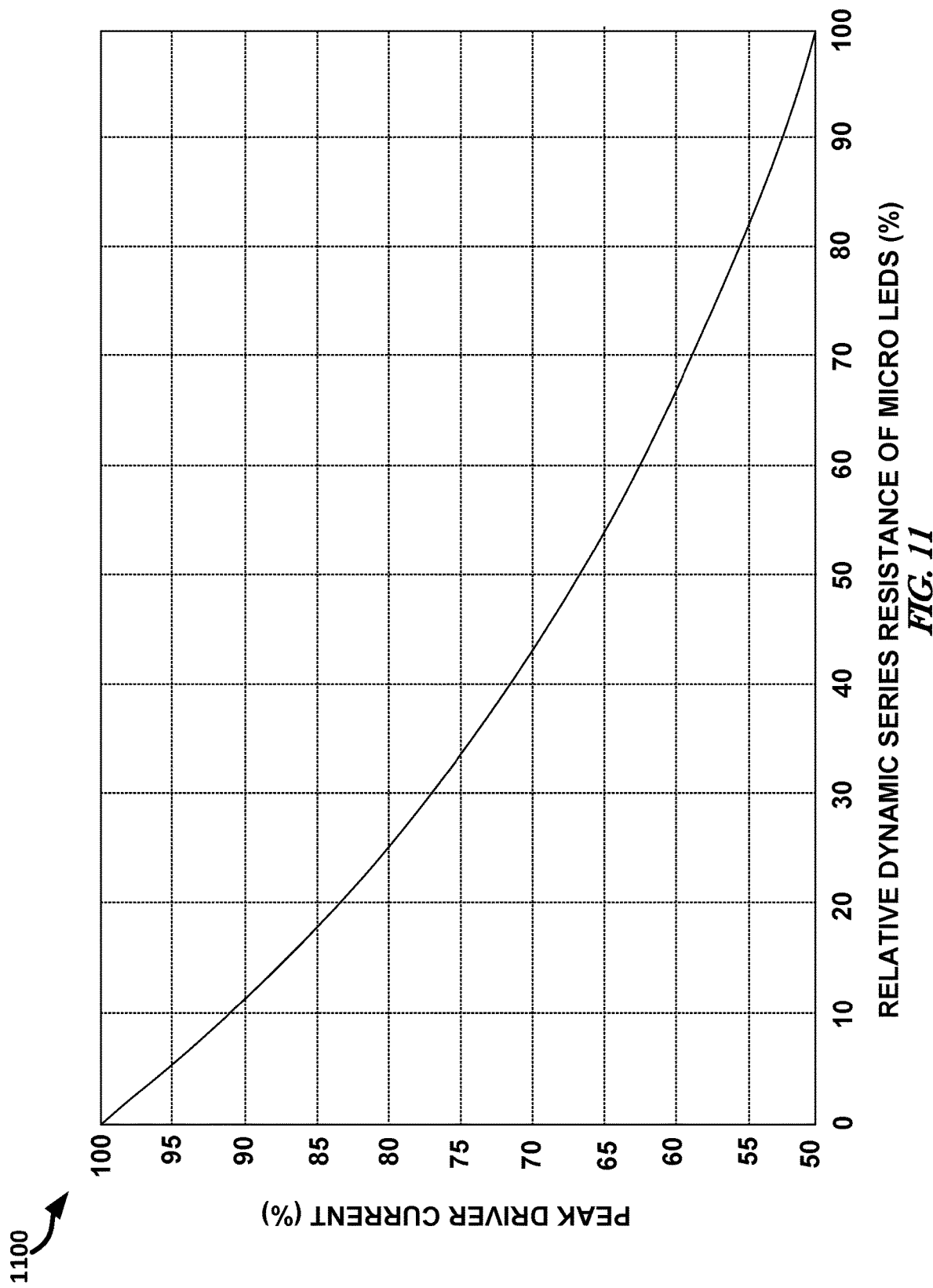
FIG. 11 illustrates, by way of example, a graph of peak driver current (%) versus dynamic series resistance of uLED.

FIG. 11 illustrates, by way of example, a graph 1100 of peak driver current (%) versus dynamic series resistance of uLED. For realizing this, there is a detection of outlier uLEDs, as well as a procedure to lower $V_{cs}$ selectively and according to said detection. A quasi-linear relation between $R_d$ and the required local reduction of the PWM on-state current is shown in FIG. 11. This establishes the maximum current capabilities imposed to the outlier pixels to avoid increasing $V_{LED}$ (and hence driver losses) above what is determined to drive the average population of pixels. For example, according to FIG. 11, an increase of 30% over Rd of the average population yields a reduction the PWM on-state current of that outlier uLED by about 23%. Without this proposed measure, to help ensure that the uLED is supplied with sufficient current, the supply voltage $V_{LED}$ 106 can increase in accord with the $R_d$ and the corresponding driver current.

Figure 12:
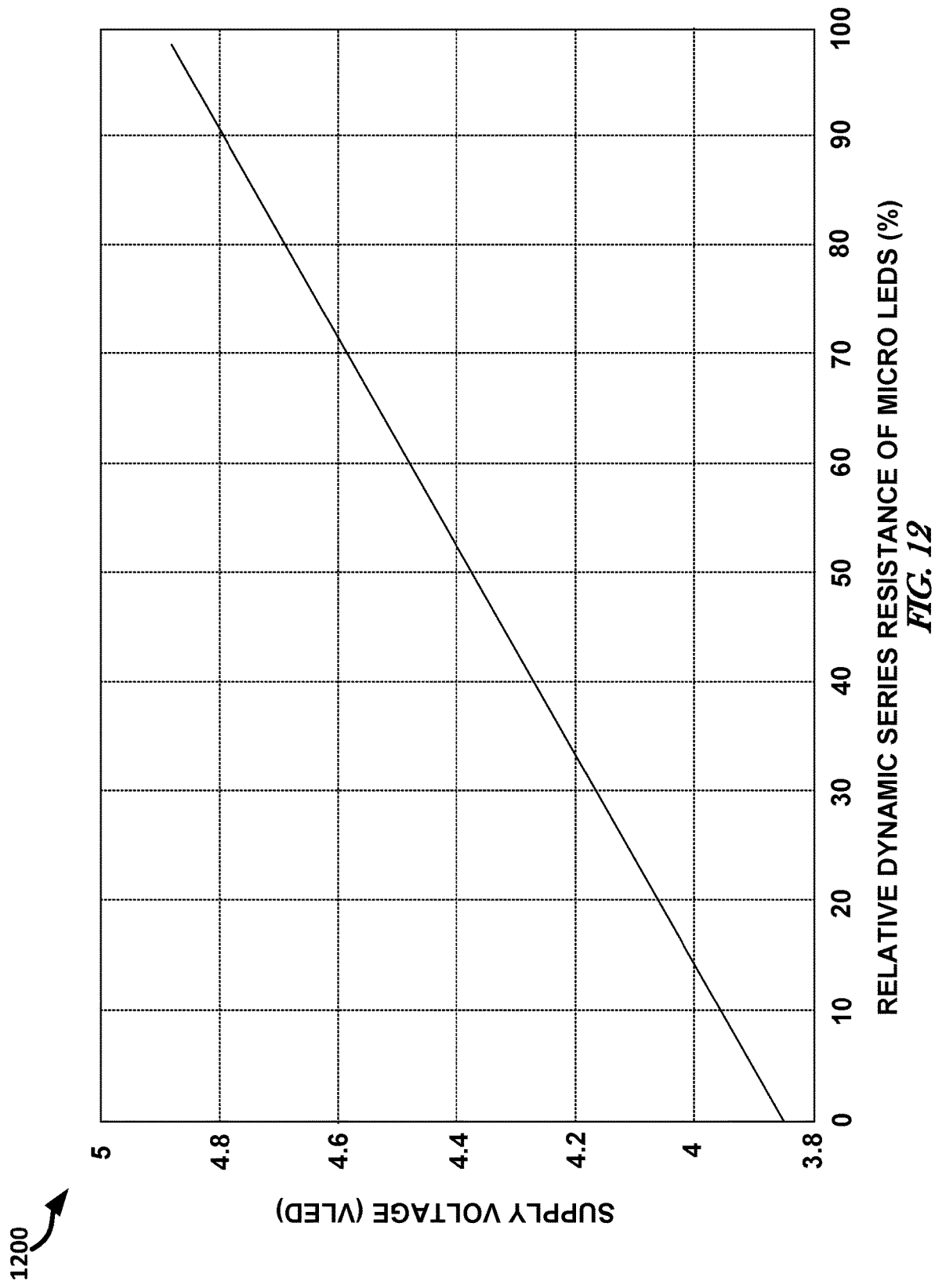
FIG. 12 illustrates, by way of example a graph of $V_{LED}$ versus relative dynamic resistance of uLEDs with outlier $R_d$.

FIG. 12 illustrates, by way of example a graph 1200 of $V_{LED}$ 106 versus relative dynamic resistance of uLEDs with outlier $R_d$, that, if followed by the controller 990, helps ensure driver voltage compliance to all uLEDs, including the outliers. A corresponding efficiency penalty is shown in FIG. 3 (solid curve). If using a solution of embodiments, the efficiency remains independent of the forward voltage ($V_f$) as indicated by the dashed line in FIG. 3

Outlier uLEDs subject to the proposed peak current limitation can remain properly driven, provided that there is enough time margin for duty-cycle correction (increasing the duty cycle in response to reducing PWM on-state current). The number of underdriven outliers depends on the target light profile and the specific uLED die. Typical light profiles in applications correspond to non-uniform light patterns (light patterns of non-uniform color). Therefore, it is expected that a large number of uLEDs operate at duty cycles that can be corrected in response to a reduction in driver current (e.g., at low or moderate duty cycle levels). Given such profile, it is statistically possible to estimate how many undriven and underdriven pixels can be found as a function of $R_d$ and the number of outliers.

Figure 13:
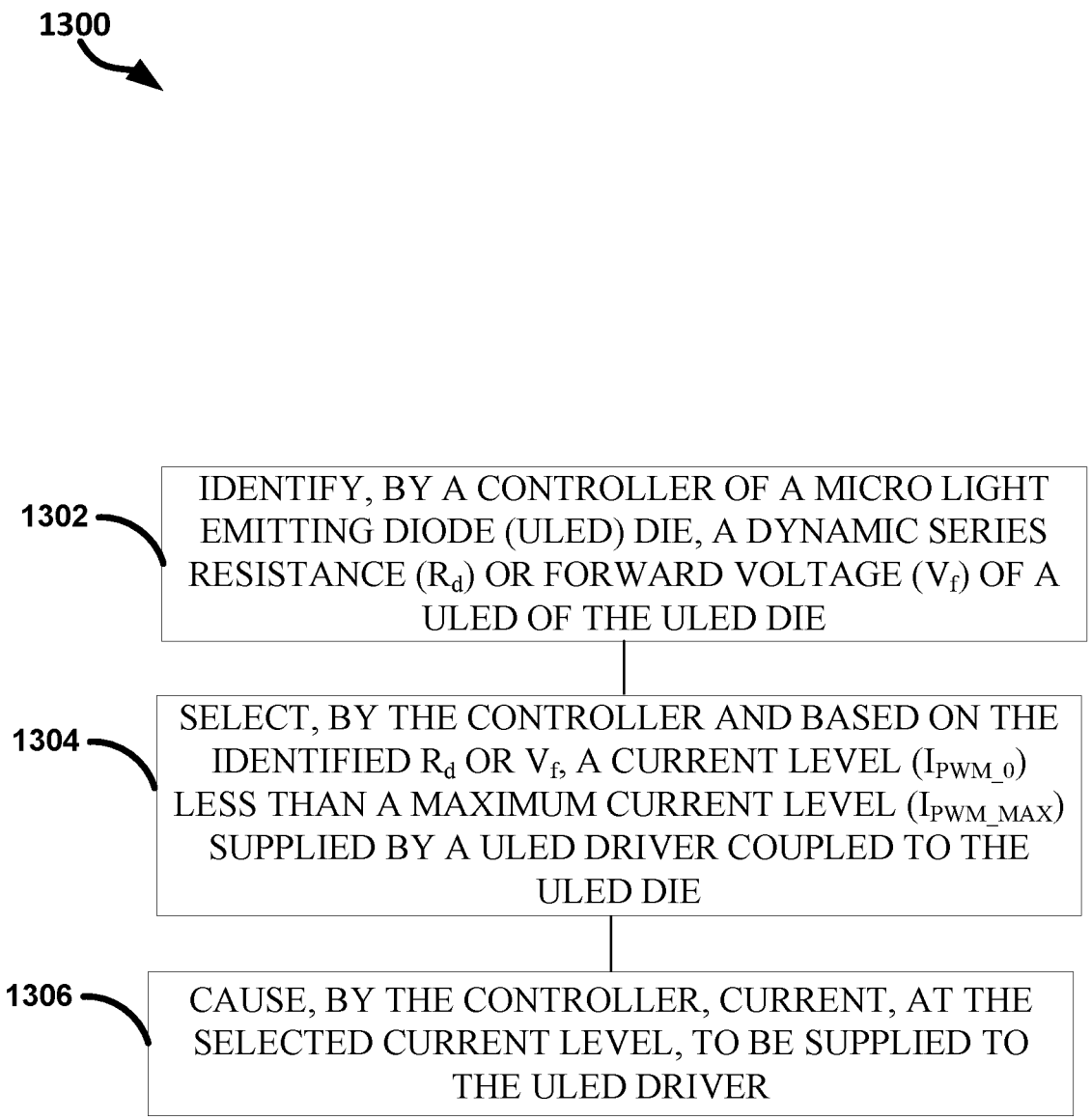
FIG. 13 illustrates, by way of example, a diagram of an embodiment of a method for driving a uLED matrix die.

FIG. 13 illustrates, by way of example, a diagram of an embodiment of a method 1300 for driving a uLED matrix die. The method 1300 can be performed, at least in part, by the voltage supply 102, the matrix of uLEDs 104, the controller 990, driver 444, other component, or a combination thereof. The method 1300, as illustrated, includes identifying, by a controller of a micro light emitting diode (uLED) die, a dynamic series resistance ($R_d$) or forward voltage ($V_f$) of a uLED of the uLED die, at operation 1302; selecting, by the controller and based on the identified $R_d$ or $V_f$, a current level ($I_{PWM\_0}$) less than a maximum current level ($I_{PWM\_MAX}$) supplied by a uLED driver coupled to the uLED die, at operation 1304; and causing, by the controller, current, at the selected current level, to be supplied to the uLED driver, at operation 1306.

The method 1300 can further include increasing, by the controller, a pulse width modulation (PWM)-on time of the uLED in response to selecting $I_{PWM\_0}$. The method 1300 can further include testing, by test equipment, each uLED of the uLED die to determine whether the uLED includes $R_d$ or $V_f$ greater than a specified threshold. The method 1300 can further include storing, in a memory accessible by a controller of the uLED die, data indicating an identification (ID) of each uLED of the uLED die that includes $R_d$ greater than the specified threshold. The method 1300 can further include determining, based on the identified $R_d$, $I_{PWM\_0}$ such that the $V_f$ of the uLED is less than (or equal to) a maximum supply voltage ($V_{LED}$).

The method 1300 can further include, wherein the controller selects $I_{PWM\_0}$ for each uLED of the uLED die that includes $R_d$ or $V_f$ greater than the specified threshold. The method 1300 can further include, wherein the specified threshold is a specified percentile of $R_d$ or $V_f$ values across all uLEDs of the uLED die. The method 1300 can further include, wherein selecting the current level ($I_{PWM\_0}$) less than a maximum current level ($I_{PWM\_MAX}$) supplied by a uLED driver coupled to the uLED die based on a difference between $R_d$ or $V_f$ of an outlier uLED and an average $R_d$ or $V_f$ of non-outlier uLEDs of the uLED die, the outlier uLED including an $R_d$ greater than a specified number of standard deviations greater than the average $R_d$ or $V_f$ of the uLEDs.

What follows are some details regarding the matrix of uLEDs 104 and some application considerations followed by some examples.

Figure 14:
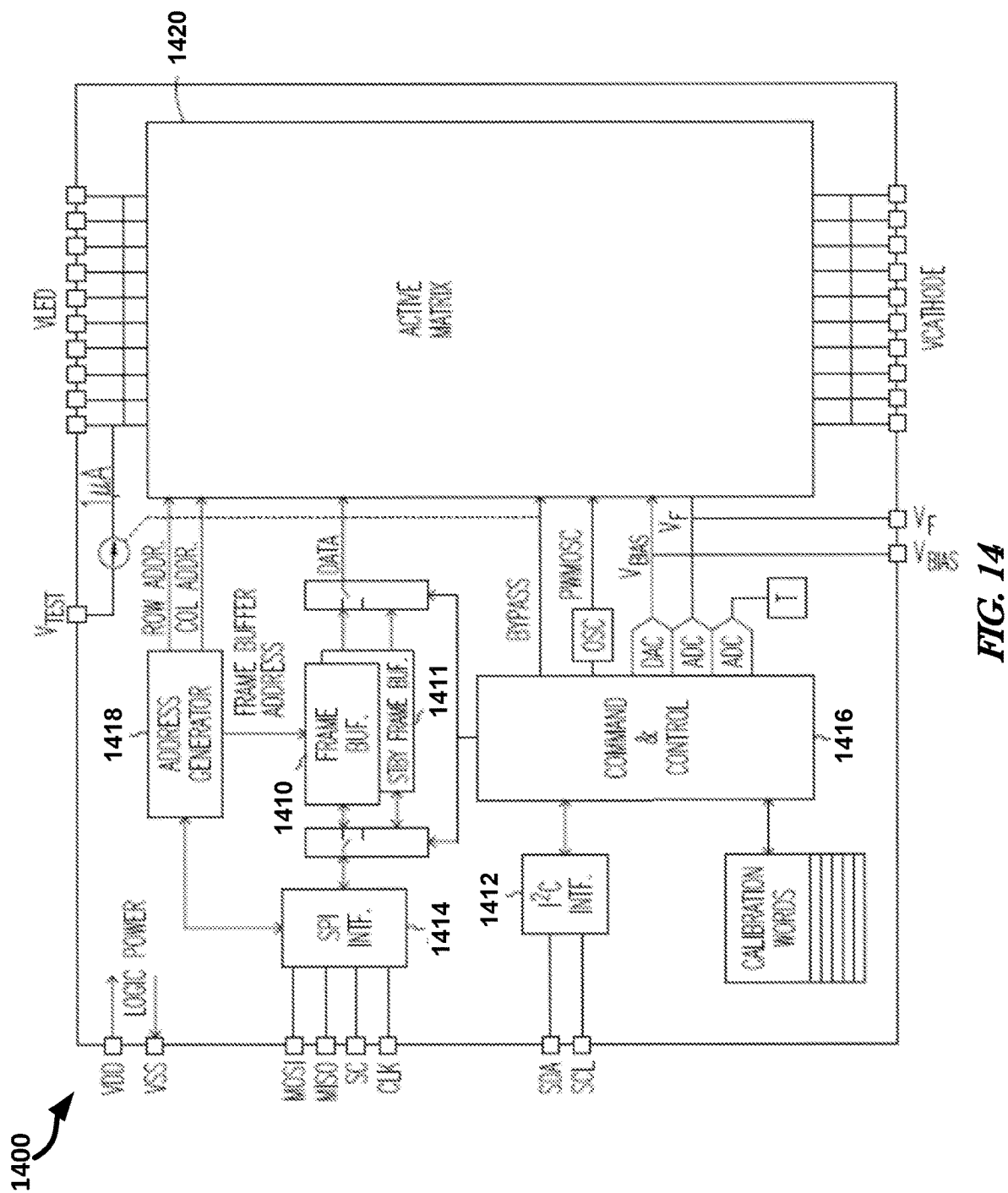
FIG. 14 illustrates in more detail an embodiment of a chip-level implementation of a system supporting functionality, such as discussed with respect to, for example, FIGS. 6-13.

FIG. 14 illustrates in more detail an embodiment of a chip-level implementation of a system 1400 supporting functionality, such as discussed with respect to, for example, FIGS. 6-13. The system 1400 includes a command and control module 1416 (sometimes called the controller, which may be similar to or the same as the controller 990 of FIG. 9) able to implement pixel or group pixel level control of amplitude and duty cycle for circuitry and procedures such as discussed with respect to FIGS. 6-13 and elsewhere herein. In some embodiments, the system 1400 further includes a frame buffer 1410 for holding generated or processed images that can be supplied to the matrix of uLEDs 1420. Other modules can include digital control interfaces, such as a serial bus (e.g., an Inter-Integrated Circuit ($I^2C$) serial bus) or Serial Peripheral Interface (SPI) (1414), that are configured to transmit control data or instructions or response data.

In operation, system 1400 can accept image or other data from a vehicle or other source that arrives via the SPI interface 1414. Successive images or video data can be stored in an image frame buffer 1410. If no image data is available, one or more standby images held in a standby image buffer 1411 can be directed to the image frame buffer 1410. Such standby images can include, for example, an intensity and spatial pattern consistent with legally allowed low beam headlamp radiation patterns of a vehicle, or default light radiation patterns for architectural lighting or displays.

In operation, pixels in the images are used to define response of corresponding LED pixels in the active, with intensity and spatial modulation of LED pixels being based on the image(s). To reduce data rate issues, groups of pixels (e.g., 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. PWM can be used to control each pixel to emit light in a pattern and with an intensity at least partially dependent on the image held in the image frame buffer 1410.

In some embodiments, the system 1400 can receive logic power via $V_{dd}$ and $V_{ss}$ pins. An active matrix receives power for LED array control by multiple $V_{LED}$ and $V_{Cathode}$ pins. The SPI 1414 can provide full duplex mode communication using a master-slave architecture with a single master. The master device originates the frame for reading and writing. Multiple slave devices are supported through selection with individual slave select (SS) lines. Input pins can include a Master Output Slave Input (MOSI), a Master Input Slave Output (MISO), a chip select (SC), and clock (CLK), all connected to the SPI interface 1414. The SPI interface 1414 connects to an address generator, frame buffer, and a standby frame buffer. Pixels can have parameters set and signals or power modified (e.g. by power gating before input to the frame buffer, or after output from the frame buffer via pulse width modulation or power gating) by a command and control module. The SPI interface 1414 can be connected to an address generation module 1418 that in turn provides row and address information to the active matrix 1420. The address generation module 1418 in turn can provide the frame buffer address to the frame buffer 1410.

In some embodiments, the command and control module 1416 can be externally controlled via the serial bus 1412. A clock (SCL) pin and data (SDA) pin, such as with 7-bit addressing can be supported. The command and control module 1416 can include a digital to analog converter (DAC) and two analog to digital converters (ADC). The DAC and ADCs are respectively used to set $V_{bias}$ for a connected active matrix, help determine maximum $V_f$, and determine system temperature. Also connected are an oscillator (OSC) to set the pulse width modulation oscillation (PWMOSC) frequency for the active matrix 1420. In one embodiment, a bypass line is also present to allow address of individual pixels or pixel blocks in the active matrix for diagnostic, calibration, or testing purposes. The active matrix 1420 can be further supported by row and column select that is used to address individual pixels, which are supplied with a data line, a bypass line, a PWMOSC line, a $V_{bias}$ line, and a $V_f$ line.

As will be understood by a person of ordinary skill in the art, in some embodiments the described circuitry and active matrix 1420 can be packaged and optionally include a submount or printed circuit board connected for powering and controlling light production by the semiconductor LED. In certain embodiments, the printed circuit board can also include electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the LED and a power supply, and also provide heat sinking.

In some embodiments, the active matrix 1420 can be formed from light emitting elements of various types, sizes, and layouts. In one embodiment, one or two dimensional matrix arrays of individually addressable light emitting diodes (LEDs) can be used. Commonly N×M arrays where N and M are respectively between two and one thousand can be used. Individual LED structures can have a square, rectangular, hexagonal, polygonal, circular, arcuate or other surface shape. Arrays of the LED assemblies or structures can be arranged in geometrically straight rows and columns, staggered rows or columns, curving lines, or semi-random or random layouts. LED assemblies can include multiple LEDs formed as individually addressable pixel arrays are also supported. In some embodiments, radial or other non-rectangular grid arrangements of conductive lines to the LED can be used. In other embodiments, curving, winding, serpentine, and/or other suitable non-linear arrangements of electrically conductive lines to the LEDs can be used.

In some embodiments, arrays of microLEDs (μLEDs or uLEDs) can be used. uLEDs can support high density pixels having a lateral dimension less than 100 μm by 100 μm. In some embodiments, uLEDs with dimensions of about 50 μm in diameter or width and smaller can be used. Such uLEDS can be used for the manufacture of color displays by aligning, in close proximity, uLEDs comprising red, blue, and green wavelengths. In other embodiments, uLEDS can be defined on a monolithic gallium nitride (GaN) or other semiconductor substrate, formed on segmented, partially, or fully divided semiconductor substrate, or individually formed or panel assembled as groupings of uLEDs. In some embodiments, the active matrix (the matrix of uLEDs 104) can include small numbers of uLEDs positioned on substrates that are centimeter scale area or greater. In some embodiments, the active matrix 1420 can support uLED pixel arrays with hundreds, thousands, or millions of LEDs positioned together on centimeter scale area substrates or smaller. In some embodiments, uLEDS can include LEDs sized between 30 microns and 500 microns. In some embodiments, each of the light emitting pixels in the light emitting pixel array can be positioned at least 1 millimeter apart to form a sparse LED array. In other embodiments sparse LED arrays of light emitting pixels can be positioned less than 1 millimeter apart and can be spaced apart by distances ranging from 30 microns to 500 microns. The LEDs can be embedded in a solid or a flexible substrate, which can be at least in part transparent. For example, the light emitting pixel arrays can be at least partially embedded in glass, ceramic, or polymeric materials.

Light emitting matrix pixel arrays, such as discussed herein, may support applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays include video lighting, automotive headlights, architectural and area illumination, street lighting, and informational displays.

Light emitting matrix pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an application that may benefit from use of light emitting pixel arrays. A single light emitting array may be used to mimic various street light types, allowing, for example, switching between a Type I linear streetlight and a Type IV semicircular streetlight by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

An LED light module can include matrix LEDS, alone or in conjunction with primary or secondary optics, including lenses or reflectors. To reduce overall data management requirements, the light module can be limited to on/off functionality or switching between relatively few light intensity levels. Full pixel level control of light intensity is not necessarily supported.

In operation, pixels in the images are used to define response of corresponding LED pixels in the pixel module, with intensity and spatial modulation of LED pixels being based on the image(s). To reduce data rate issues, groups of pixels (e.g. 5×5 blocks) can be controlled as single blocks in some embodiments. High speed and high data rate operation is supported, with pixel values from successive images able to be loaded as successive frames in an image sequence at a rate between 30 Hz and 100 Hz, with 60 Hz being typical. In conjunction with a pulse width modulation module, each pixel in the pixel module can be operated to emit light in a pattern and with intensity at least partially dependent on the image held in the image frame buffer.

Figure 15:
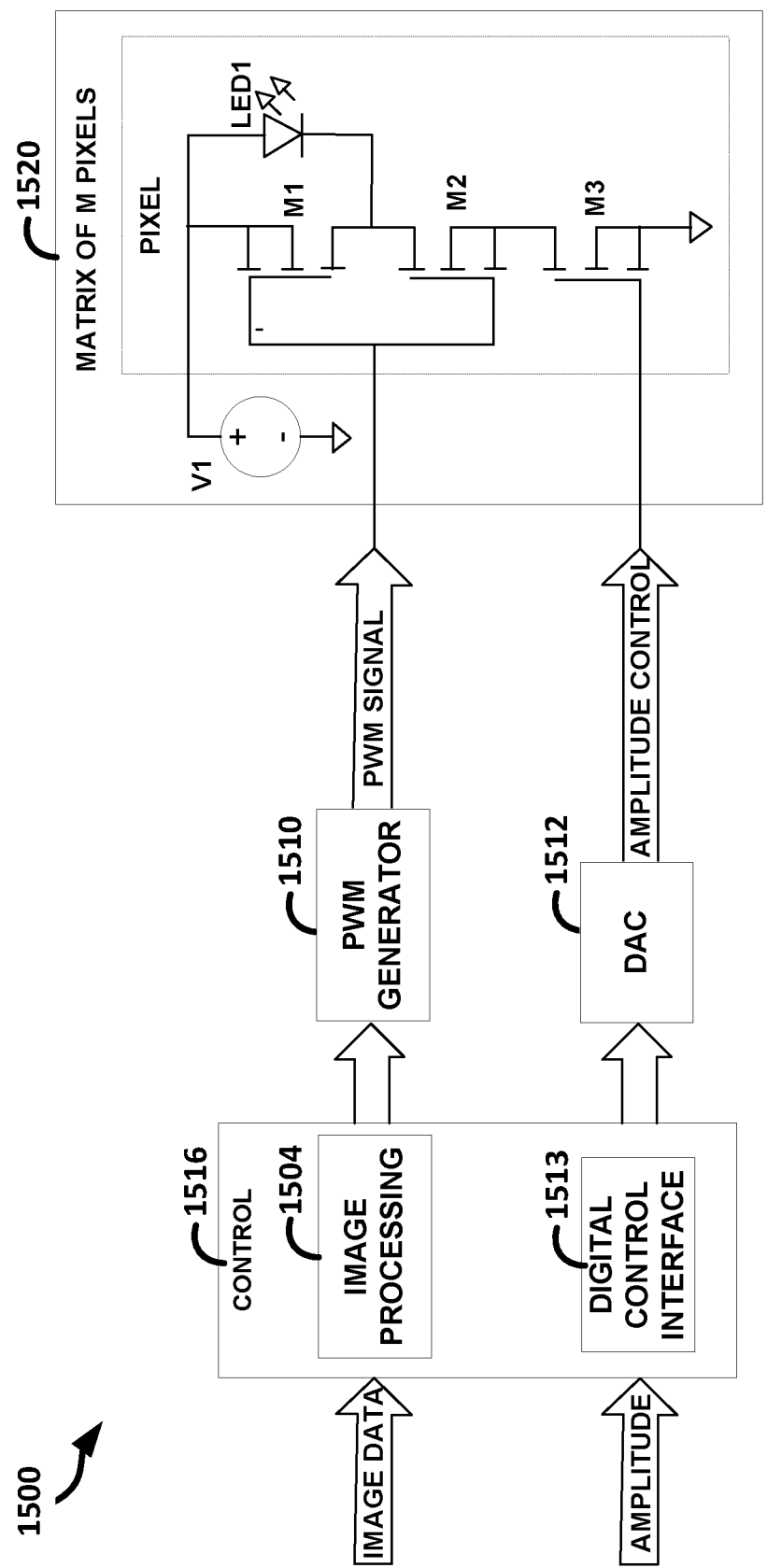
FIG. 15 illustrates, by way of example, a logical block diagram of a system that includes circuitry that can be included in a uLED package.

In the foregoing described embodiments, intensity of a uLED can be separately controlled and adjusted by setting appropriate ramp times and pulse width for each LED pixel using a suitable lighting logic, control module, and/or PWM module. Outlier pixel voltage management can provide LED pixel activation to provide reliable patterned lighting. A control system 1500 that can provide voltage supply 102 voltage management is illustrated in FIG. 15. As seen in FIG. 15, a matrix micro-LED array 1520 can contain one or more arrays of thousands to millions of microscopic LED pixels that actively emit light and are individually controlled. To emit light in a pattern or sequence that results in display of an image, the current levels of the micro-LED pixels at different locations on an array are adjusted individually according to a specific image. This can involve a PWM, which turns on and off the pixels at a certain frequency. During PWM operation, the average DC current through a pixel is the product of the electrical current amplitude and the PWM duty cycle, which is the ratio between the conduction time and the period or cycle time.

FIG. 15 illustrates, by way of example, a logical block diagram of a system 1500 that includes circuitry that can be included in a uLED package. Processing modules that facilitate efficient usage of the system 1500 are illustrated in FIG. 15. The system 1500 includes a control module 1516 able to implement pixel or group pixel level control of amplitude and duty cycle for circuitry and procedures such as discussed with respect to FIGS. 6-14. In some embodiments, the system 1500 further includes an image processing module 1504 to generate, process, or transmit an image, and digital control interfaces 1513, such as inter-integrated circuit (I2C), serial peripheral interface (SPI), controller area network (CAN), universal asynchronous receiver transmitter (UART), or the like, that is configured to transmit control data and/or instructions. The digital control interfaces 1513 and control module 1516 may include a system microcontroller and any type of wired or wireless module configured to receive a control input from an external device. By way of example, a wireless module may include Bluetooth, Zigbee, Z-wave, mesh, WiFi, near field communication (NFC) and/or peer to peer modules may be used. The microcontroller may be any type of special purpose computer or processor that may be embedded in an LED lighting system and configured or configurable to receive inputs from the wired or wireless module or other modules in the LED system and provide control signals to other modules based thereon. Algorithms implemented by the microcontroller or other suitable control module 1516 may be implemented in a computer program, software, or firmware incorporated in a non-transitory computer-readable storage medium for execution by the special purpose processor. Examples of non-transitory computer-readable storage mediums include a read only memory (ROM), a random access memory (RAM), a register, cache memory, and semiconductor memory devices. The memory may be included as part of the microcontroller or may be implemented elsewhere, either on or off a printed circuit or electronics board The term module, as used herein, may refer to electrical and/or electronic components disposed on individual circuit boards that may be soldered to one or more electronics boards. The term module may, however, also refer to electrical and/or electronic components that provide similar functionality, but which may be individually soldered to one or more circuit boards in a same region or in different regions.

The control module 1516 (similar to or same as the controller 990) can further include the image processing module 1504 and the digital control interfaces 1513 such as PC. As will be appreciated, in some embodiments an image processing computation may be done by the control module 1516 through directly generating a modulated image. Alternatively, a standard image file can be processed or otherwise converted to provide modulation to match the image. Image data that mainly contains PWM duty cycle values can be processed for all pixels in image processing module 1504. Since amplitude is a fixed value or rarely changed value, amplitude related commands can be given separately through a simpler digital interface, such as I²C. The control module 1516 interprets digital data, which can be used by PWM generator 1510 to generate PWM signals for pixels, and by Digital-to-Analog Converter (DAC) 1512 to generate the control signals for obtaining the required current source amplitude.

Figure 16:
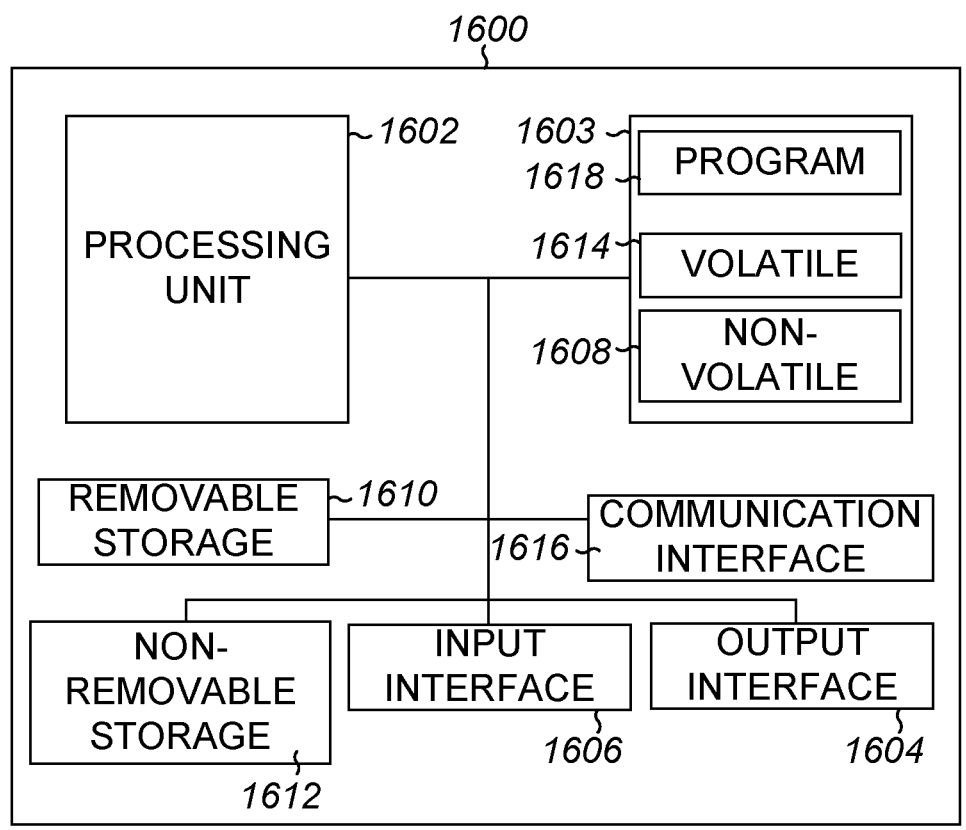
FIG. 16 illustrates, by way of example, a block diagram of an embodiment of a machine (e.g., a computer system) to implement one or more embodiments.

In some embodiments, the matrix micro-LED array 1520 in FIG. 15 can include m pixels including m common anode LEDs. In one example embodiment the pixel unit includes a single LED, LED1, and three transconductance devices (MOSFET switches) M1 through M3, and is supplied by the voltage supply VI (sometimes called $V_{LED}$). M3 is an N-channel metal oxide semiconductor field effect transistor (MOSFET) whose gate is coupled to the amplitude control signal to generate the required current source amplitude. The P-channel MOSFET M1 is in parallel to LED1 and forms a totem pole pair with the N-channel MOSFET M2. The gates of the M1 and M2 transistor pair are tied together and coupled to the PWM signal. Therefore, when PWM is high, M1 will be tuned off and M2 will be turned on. A current will flow through LED1, M2, and M3 with a value determined by the amplitude control signal coupled to M3 gate. When PWM is low, M1 will be turned on and M2 will be turned off Consequently, the current source of M3 will be cut off and the LED will be fast discharged through M1, FIG. 16 illustrates, by way of example, a block diagram of an embodiment of a machine 1600 (e.g., a computer system) to implement one or more embodiments. The machine 1600 can implement a technique for managing underdriven or undriven uLEDs of a uLED die. The controller 990, test equipment 992, voltage supply 102, or a component thereof can include one or more of the components of the machine 1600. One or more of the controller 990, test equipment 992, voltage supply 102, or a component thereof can be implemented, at least in part, using a component of the machine 1600. One example machine 1600 (in the form of a computer), may include a processing unit 1602, memory 1603, removable storage 1610, and non-removable storage 1612. Although the example computing device is illustrated and described as machine 1600, the computing device may be in different forms in different embodiments. For example, the computing device may instead be a smartphone, a tablet, smartwatch, or other computing device including the same or similar elements as illustrated and described regarding FIG. 16. Devices such as smartphones, tablets, and smartwatches are generally collectively referred to as mobile devices. Further, although the various data storage elements are illustrated as part of the machine 1600, the storage may also or alternatively include cloud-based storage accessible via a network, such as the Internet.

Memory 1603 may include volatile memory 1614 and non-volatile memory 1608. The machine 1600 may include—or have access to a computing environment that includes—a variety of computer-readable media, such as volatile memory 1614 and non-volatile memory 1608, removable storage 1610 and non-removable storage 1612. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1600 may include or have access to a computing environment that includes input 1606, output 1604, and a communication connection 1616. Output 1604 may include a display device, such as a touchscreen, that also may serve as an input device. The input 1606 may include one or more of a touchscreen, touchpad, mouse, keyboard, camera, one or more device-specific buttons, one or more sensors integrated within or coupled via wired or wireless data connections to the machine 1600, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi®), Bluetooth®, or other networks.

Computer-readable instructions stored on a computer-readable storage device are executable by the processing unit 1602 (sometimes called processing circuitry) of the machine 1600. A hard drive, CD-ROM, and RAM are some examples of articles including a non-transitory computer-readable medium such as a storage device. For example, a computer program 1618 may be used to cause processing unit 1602 to perform one or more methods or algorithms described herein. Non-transitory does not mean incapable of being in motion (incapable of being in transit).

To further illustrate the apparatus and related method disclosed herein, a non-limiting list of examples is provided below. Each of the following non-limiting examples can stand on its own or can be combined in any permutation or combination with any one or more of the other examples.

In Example 1 a method includes identifying, by a controller of a micro light emitting diode (uLED) die, a dynamic series resistance ($R_d$) or forward voltage ($V_f$) of a uLED of the uLED die, selecting, by the controller and based on the identified $R_d$ or $V_f$, a current level ($I_{PWM\_0}$) less than a maximum current level ($I_{PWM\_MAX}$) supplied by a uLED driver coupled to the uLED die, and causing, by the controller, current, at the selected current level, to be supplied to the uLED driver.

In Example 2, Example 1 can further include increasing, by the controller, a pulse width modulation (PWM)-on time of the uLED in response to selecting $I_{PWM\_0}$.

In Example 3, at least one of Examples 1-2 can further include testing, by test equipment, each uLED of the uLED die to determine whether the uLED includes $R_d$ or $V_f$ greater than a specified threshold.

In Example 4, Example 3 can further include storing, in a memory accessible by a controller of the uLED die, data indicating an identification (ID) of each uLED of the uLED die that includes $R_d$ greater than the specified threshold.

In Example 5, Example 4 can further include determining, based on the identified $R_d$, $I_{PWM\_0}$ such that the $V_f$ of the uLED is less than (or equal to) a maximum supply voltage ($V_{LED}$).

In Example 6, at least one of Examples 3-5 can further include, wherein the controller selects $I_{PWM\_0}$ for each uLED of the uLED die that includes $R_d$ or $V_f$ greater than the specified threshold.

In Example 7, at least one of Examples 3-6 can further include, wherein the specified threshold is a specified percentile of $R_d$ or $V_f$ values across all uLEDs of the uLED die.

In Example 8, at least one of Examples 1-7, wherein selecting the current level ($I_{PWM\_0}$) less than a maximum current level ($I_{PWM\_MAX}$) supplied by a uLED driver coupled to the uLED die based on a difference between $R_d$ or $V_f$ of an outlier uLED and an average $R_d$ or $V_f$ of non-outlier uLEDs of the uLED die, the outlier uLED including an $R_d$ greater than a specified number of standard deviations greater than the average $R_d$ or $V_f$ of the uLEDs.

Example 9 can include a system comprising a micro light emitting diode (uLED) die comprising uLEDs and respective uLED drivers, a power supply coupled to the uLED die, and a controller coupled to the uLED die, the controller configured to identify, a dynamic series resistance ($R_d$) or forward voltage ($V_f$) of a uLED of the uLED die, select, based on the identified $R_d$ or $V_f$, a current level ($I_{PWM\_0}$) less than a maximum current level ($I_{PWM\_MAX}$) supplied by a uLED driver of the uLED die, and cause the power supply to provide electrical current at the selected current level to the uLED driver.

In Example 10, Example 9 can further include, wherein the controller is further configured to increase a pulse width modulation (PWM)-on time of the uLED in response to selecting $I_{PWM\_0}$.

In Example 11, at least one of Examples 9-10 can further include test equipment configured to test each uLED of the uLED die to determine whether the uLED includes $R_d$ or $V_f$ greater than a specified threshold.

In Example 12, Example 11 can further include a memory accessible by the controller of the uLED die to store data indicating an identification (ID) of each uLED of the uLED die that includes $R_d$ greater than the specified threshold.

In Example 13, Example 12 can further include, wherein the controller is further configured to determine, based on the identified $R_d$, $I_{PWM\_0}$ such that the $V_f$ of the uLED is less than (or equal to) a maximum supply voltage ($V_{LED}$).

In Example 14, at least one of Examples 11-13 can further include, wherein the controller selects $I_{PWM\_0}$ for each uLED of the uLED die that includes $R_d$ or $V_f$ greater than the specified threshold.

Example 15 includes a machine-readable medium including instructions that, when executed by a machine, cause the machine to perform operations comprising identifying, a dynamic series resistance ($R_d$) or forward voltage ($V_f$) of a micro light emitting diode (uLED) of a uLED die, selecting, based on the identified $R_d$ or $V_f$, a current level ($I_{PWM\_0}$) less than a maximum current level ($I_{PWM\_MAX}$) supplied by a uLED driver of the uLED die, and causing a power supply to provide electrical current at the selected current level to the uLED driver.

In Example 16, Example 15 can further include, wherein the operations further comprise increasing, by the controller, a pulse width modulation (PWM)-on time of the uLED in response to selecting $I_{PWM\_0}$.

In Example 17, at least one of Examples 15-16 can further include, wherein the operations further comprise testing each uLED of the uLED die to determine whether the uLED includes $R_d$ or $V_f$ greater than a specified threshold.

In Example 18, Example 17 can further include, wherein the operations further comprise storing, in a memory, data indicating an identification (ID) of each uLED of the uLED die that includes $R_d$ greater than the specified threshold.

In Example 19, at least one of Examples 17-18 can further include, wherein the specified threshold is a specified percentile of $R_d$ or $V_f$ values across all uLEDs of the uLED die.

In Example 20, at least one of Examples 15-19 can further include, wherein selecting the current level ($I_{PWM\_0}$) less than a maximum current level ($I_{PWM\_MAX}$) supplied by a uLED driver coupled to the uLED die based on a difference between $R_d$ or $V_f$ of an outlier uLED and an average $R_d$ or $V_f$ of non-outlier uLEDs of the uLED die, the outlier uLED including an $R_d$ greater than a specified number of standard deviations greater than the average $R_d$ or $V_f$ of the uLEDs.

While example embodiments of the present disclosed subject matter have been shown and described herein, it will be obvious to those skilled in the art that such embodiments are provided by way of example only. Numerous variations, changes, and substitutions will now occur to those skilled in the art, upon reading and understanding the material provided herein, without departing from the disclosed subject matter. It should be understood that various alternatives to the embodiments of the disclosed subject matter described herein may be employed in practicing the various embodiments of the subject matter. It is intended that the following claims define the scope of the disclosed subject matter and that methods and structures within the scope of these claims and their equivalents be covered thereby.

What is claimed is:

1. A method comprising:
identifying, by a controller of a micro light emitting diode (uLED) die, a dynamic series resistance ($R_d$) or forward voltage ($V_f$) of a uLED of the uLED die;
selecting, by the controller and based on the identified $R_d$ or $V_f$, a current level ($I_{PWM\_0}$) less than a maximum current level ($I_{PWM\_MAX}$) supplied by a uLED driver coupled to the uLED die; and
causing, by the controller, an electrical current, at the selected current level, to be supplied to the uLED driver.

2. The method of claim 1, further comprising increasing, by the controller, a pulse width modulation (PWM)-on time of the uLED in response to selecting $I_{PWM\_0}$.

3. The method of claim 1, further comprising testing, by test equipment, each uLED of the uLED die to determine whether the uLED includes $R_d$ or $V_f$ greater than a specified threshold.

4. The method of claim 3, further comprising storing, in a memory accessible by a controller of the uLED die, data indicating an identification (ID) of each uLED of the uLED die that includes $R_d$ greater than the specified threshold.

5. The method of claim 4, further comprising determining, based on the identified $R_d$, $I_{PWM\_0}$ such that the $V_f$ of the uLED is less than (or equal to) a maximum supply voltage ($V_{LED}$).

6. The method of claim 3, wherein the controller selects $I_{PWM\_0}$ for each uLED of the uLED die that includes $R_d$ or $V_f$ greater than the specified threshold.

7. The method of claim 3, wherein the specified threshold is a specified percentile of $R_d$ or $V_f$ values across all uLEDs of the uLED die.

8. The method of claim 1, wherein selecting the current level ($I_{PWM\_0}$) less than a maximum current level ($I_{PWM\_MAX}$) supplied by a uLED driver coupled to the uLED die based on a difference between $R_d$ or $V_f$ of an outlier uLED and an average $R_d$ or $V_f$ of non-outlier uLEDs of the uLED die, the outlier uLED including an $R_d$ greater than a specified number of standard deviations greater than the average $R_d$ or $V_f$ of the uLEDs.

9. A system comprising:
a micro light emitting diode (uLED) die comprising uLEDs and respective uLED drivers;
a power supply coupled to the uLED die; and
a controller coupled to the uLED die, the controller to provide a control command and configured to:
identify, a dynamic series resistance ($R_d$) or forward voltage ($V_f$) of a uLED of the uLED die;
select, based on the identified $R_d$ or $V_f$, a current level ($I_{PWM\_0}$) less than a maximum current level ($I_{PWM\_MAX}$) supplied by a uLED driver of the uLED die; and
cause the power supply to provide an electrical current at the selected current level to the uLED driver.

10. The system of claim 9, wherein the controller is further configured to increase a pulse width modulation (PWM)-on time of the uLED in response to selecting $I_{PWM\_0}$.

11. The system of claim 9, further comprising test equipment configured to test each uLED of the uLED die to determine whether the uLED includes $R_d$ or $V_f$ greater than a specified threshold.

12. The system of claim 11, further comprising a memory accessible by the controller of the uLED die to store data indicating an identification (ID) of each uLED of the uLED die that includes $R_d$ greater than the specified threshold.

13. The system of claim 12, wherein the controller is further configured to determine, based on the identified $R_d$, $I_{PWM\_0}$ such that the $V_f$ of the uLED is less than (or equal to) a maximum supply voltage ($V_{LED}$).

14. The system of claim 11, wherein the controller selects $I_{PWM\_0}$ for each uLED of the uLED die that includes $R_d$ or $V_f$ greater than the specified threshold.

15. A machine-readable medium including instructions that, when executed by a hardware-based processor, cause a machine to perform operations comprising:
identifying, by a controller, a dynamic series resistance ($R_d$) or forward voltage ($V_f$) of a micro light emitting diode (uLED) of a uLED die;
select, by the controller, based on the identified $R_d$ or $V_f$, a current level ($I_{PWM\_0}$) less than a maximum current level ($I_{PWM\_MAX}$) supplied by a uLED driver of the uLED die; and
cause, by the controller, a power supply to provide an electrical current at the selected current level to the uLED driver.

16. The machine-readable medium of claim 15, wherein the operations further comprise increasing, by the controller, a pulse width modulation (PWM)-on time of the uLED in response to selecting $I_{PWM\_0}$.

17. The machine-readable medium of claim 15, wherein the operations further comprise testing, by test equipment, each uLED of the uLED die to determine whether the uLED includes $R_d$ or $V_f$ greater than a specified threshold.

18. The machine-readable medium of claim 17, wherein the operations further comprise storing, in a memory, data indicating an identification (ID) of each uLED of the uLED die that includes $R_d$ greater than the specified threshold.

19. The machine-readable medium of claim 17, wherein the specified threshold is a specified percentile of $R_d$ or $V_f$ values across all uLEDs of the uLED die.

20. The machine-readable medium of claim 15, wherein selecting the current level ($I_{PWM\_0}$) less than a maximum current level ($I_{PWM\_MAX}$) supplied by a uLED driver coupled to the uLED die based on a difference between $R_d$ or $V_f$ of an outlier uLED and an average $R_d$ or $V_f$ of non-outlier uLEDs of the uLED die, the outlier uLED including an $R_d$ greater than a specified number of standard deviations greater than the average $R_d$ or $V_f$ of the uLEDs.

* * * * *